United States Patent
Matsumoto

(10) Patent No.: US 10,062,540 B2
(45) Date of Patent: Aug. 28, 2018

(54) MULTI CHARGED PARTICLE BEAM EXPOSURE METHOD, AND MULTI CHARGED PARTICLE BEAM BLANKING APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/466,304

(22) Filed: Mar. 22, 2017

(65) Prior Publication Data
US 2017/0301506 A1    Oct. 19, 2017

(30) Foreign Application Priority Data
Apr. 15, 2016   (JP) ................. 2016-081880

(51) Int. Cl.
  *H01J 37/04*    (2006.01)
  *H01J 37/147*   (2006.01)
  *H01J 37/317*   (2006.01)

(52) U.S. Cl.
  CPC ........ *H01J 37/045* (2013.01); *H01J 37/1472* (2013.01); *H01J 37/3177* (2013.01);
  (Continued)

(58) Field of Classification Search
  CPC .. H01J 37/045; H01J 37/1471; H01J 37/1472; H01J 37/302; H01J 37/3023;
  (Continued)

(56) References Cited

U.S. PATENT DOCUMENTS 9,287,090 B2    3/2016  Yoshikawa et al.
2010/0124722 A1  5/2010  Fragner et al.
(Continued)

FOREIGN PATENT DOCUMENTS

JP    2007-329220    12/2007
JP    2010-123966     6/2010
(Continued)

OTHER PUBLICATIONS

Taiwanese Office Action dated May 4, 2018 in Taiwanese Application No. 106107602, with English Translation, citing document AO therein, 8 pages.

*Primary Examiner* — David E Smith
(74) *Attorney, Agent, or Firm* — Oblon, McClelland, Maier & Neustadt, L.L.P.

(57) ABSTRACT

A multi charged particle beam exposure method includes transmitting ON/OFF control signals each being an ON/OFF control signal for a corresponding beam of multi-beams of charged particle beams in a batch to a blanking apparatus in which there are mounted a substrate where a plurality of passage holes are formed to let a corresponding beam of the multi-beams individually pass therethrough, and a plurality of individual blanking mechanisms arranged in the substrate to individually perform blanking deflection of each beam of the multi-beams, and irradiating the substrate with the multi-beams in accordance with the ON/OFF control signals transmitted in a batch, while shifting an irradiation timing for each group obtained by grouping the multi-beams into a plurality of groups by a plurality of individual blanking mechanisms mounted in the blanking apparatus.

9 Claims, 23 Drawing Sheets

(52) U.S. Cl.
CPC ............... *H01J 2237/0437* (2013.01); *H01J 2237/31761* (2013.01)

(58) Field of Classification Search
CPC ............ H01J 37/3026; H01J 37/3171; H01J 37/3174; H01J 2237/0435; H01J 2237/0437; H01J 2237/31761; H01J 2237/31764; H01J 37/3177
See application file for complete search history.

(56) References Cited

U.S. PATENT DOCUMENTS

| | | | | |
|---|---|---|---|---|
| 2012/0286170 | A1* | 11/2012 | Van De Peut | B82Y 10/00 250/397 |
| 2013/0011796 | A1* | 1/2013 | Hirata | H01J 37/3177 430/296 |
| 2015/0155138 | A1* | 6/2015 | Yoshikawa | H01J 37/3177 250/492.22 |
| 2017/0133199 | A1* | 5/2017 | Lee | H01J 37/3177 |

FOREIGN PATENT DOCUMENTS

| | | |
|---|---|---|
| JP | 2015-109323 | 6/2015 |
| TW | 201535462 A | 9/2015 |

* cited by examiner

Load 1
Load 2

Shot 1
Shot 2

| No. | k' | tk' |
|---|---|---|
| 1 | 9 | 512Δ |
| 2 | 8 | 256Δ |
| 3 | 7 | 128Δ |
| 4 | 6 | 64Δ |
| 5 | 5 | 32Δ |
| 6 | 4 | 16Δ |
| 7 | 3 | 8Δ |
| 8 | 2 | 4Δ |
| 9 | 1 | 2Δ |
| 10 | 0 | Δ |

FIG.19

MULTI CHARGED PARTICLE BEAM EXPOSURE METHOD, AND MULTI CHARGED PARTICLE BEAM BLANKING APPARATUS

CROSS-REFERENCE TO RELATED APPLICATION

This application is based upon and claims the benefit of priority from the prior Japanese Patent Application No. 2016-081880 filed on Apr. 15, 2016 in Japan, the entire contents of which are incorporated herein by reference.

BACKGROUND OF THE INVENTION

Field of the Invention

Embodiments of the present invention relate generally to a multi charged particle beam exposure method, and a multi charged particle beam blanking apparatus, and more specifically, relate to a beam irradiation method in multi-beam writing, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" with electron beams on a wafer, etc.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system, and deflects the beam by a deflector to irradiate a desired position on a target object or "sample".

In multi-beam writing, the dose of each beam is individually controlled based on the irradiation time. A control circuit for performing an individual control is included in a blanking aperture array apparatus mounted in the body of the writing apparatus. In multi-beam writing, for further improving the throughput, it would be necessary to increase the current density so as to reduce the irradiation time of each beam. However, when increasing the current density, there is a problem in that a so-called blur and/or positional deviation of a multi-beam image occurs due to the Coulomb effect, depending on a total current amount of simultaneously irradiating multi-beams.

As for the apparatus which performs ON/OFF control of beam arrays at the same timing, there is proposed a method of grouping beam arrays, and applying a blanking voltage (signal) from the blanking control circuit outside the writing apparatus to the blanker array in each group, at a different (shifted) applying time to the apparatus in order to shift the irradiation timing of beams (for example, refer to Japanese Patent Application Laid-open No. 2007-329220). Moreover, it is also proposed that by this method the dose can be adjusted for each group. However, according to this method, it is difficult to individually control the dose of each beam by the irradiation time. Further, it is also difficult to include a control circuit for controlling the dose of an individual beam in the blanking aperture array apparatus.

Then, it can be thought to group beam arrays, and, to transmit, for each group, an exposure time control signal at a different (shifted) time to a blanking aperture array apparatus including a control circuit for controlling the dose of an individual beam in order to shift the irradiation timing of beams. However, according to this method, since the cycle of one beam shot is merely divided into cycles of two beam shots, the number of times of transmitting the exposure time control signal becomes double, and, as a result, the exposure time becomes double. Therefore, even if intending to improve the throughput by performing multi-beams, it turns out to be difficult to thoroughly achieve the effect.

BRIEF SUMMARY OF THE INVENTION

According to one aspect of the present invention, a multi charged particle beam exposure method includes transmitting ON/OFF control signals each being an ON/OFF control signal for a corresponding beam of multi-beams of charged particle beams in a batch to a blanking apparatus in which there are mounted a substrate where a plurality of passage holes are formed to let a corresponding beam of the multi-beams individually pass therethrough, and a plurality of individual blanking mechanisms arranged in the substrate to individually perform blanking deflection of each beam of the multi-beams; and irradiating the substrate with the multi-beams in accordance with the ON/OFF control signals transmitted in the batch, while shifting an irradiation timing for each group obtained by grouping the multi-beams into a plurality of groups by the plurality of individual blanking mechanisms mounted in the blanking apparatus.

According to another aspect of the present invention, a multi charged particle beam blanking apparatus includes a substrate in which a plurality of passage holes in an array are formed to let a corresponding beam of multi-beams of charged particle beams individually pass therethrough; a plurality of storage devices, arranged inside the substrate, configured to temporarily store ON/OFF control signals each being an ON/OFF control signal for a corresponding beam of the multi-beams transmitted in a batch and to group the multi-beams into a plurality of groups; a plurality of switching circuits, arranged inside the substrate and each individually connected to a corresponding storage device of the plurality of storage devices, each configured to switch electric potentials of binary values each other in accordance with the ON/OFF control signal stored in the corresponding storage device of the plurality of storage devices; and a plurality of electrode pairs each composed of two electrodes, arranged at the substrate such that the two electrodes are opposite each other with respect to a corresponding one of the plurality of passage holes, configured to individually perform blanking deflection of a corresponding beam of the multi-beams by one of the electric potentials switched by a corresponding switching circuit in the plurality of switching circuits, wherein the plurality of storage devices output the ON/OFF control signal stored in a storage device concerned to a corresponding switching circuit while shifting an output timing for each group of the plurality of groups.

BRIEF DESCRIPTION OF THE DRAWINGS

FIG. 19 shows an example of digit numbers of a plurality of divided shots and their corresponding irradiation time according to the second embodiment;

DETAILED DESCRIPTION OF THE INVENTION

Embodiments below describe an exposure method and a blanking apparatus that can inhibit the Coulomb effect while inhibiting throughput degradation of multi-beam writing.

In the embodiments below, there will be described a configuration in which an electron beam is used as an example of a charged particle beam. The charged particle beam is not limited to the electron beam, and other charged particle beam such as an ion beam may also be used. Moreover, in the Embodiment, the configuration using a writing apparatus as an example of an exposure apparatus will be described. However, the exposure apparatus is not limited to the writing apparatus, and may be an exposure apparatus, such as an inspection apparatus, which irradiates a target object with charged particle beams.

First Embodiment

Figure 1:
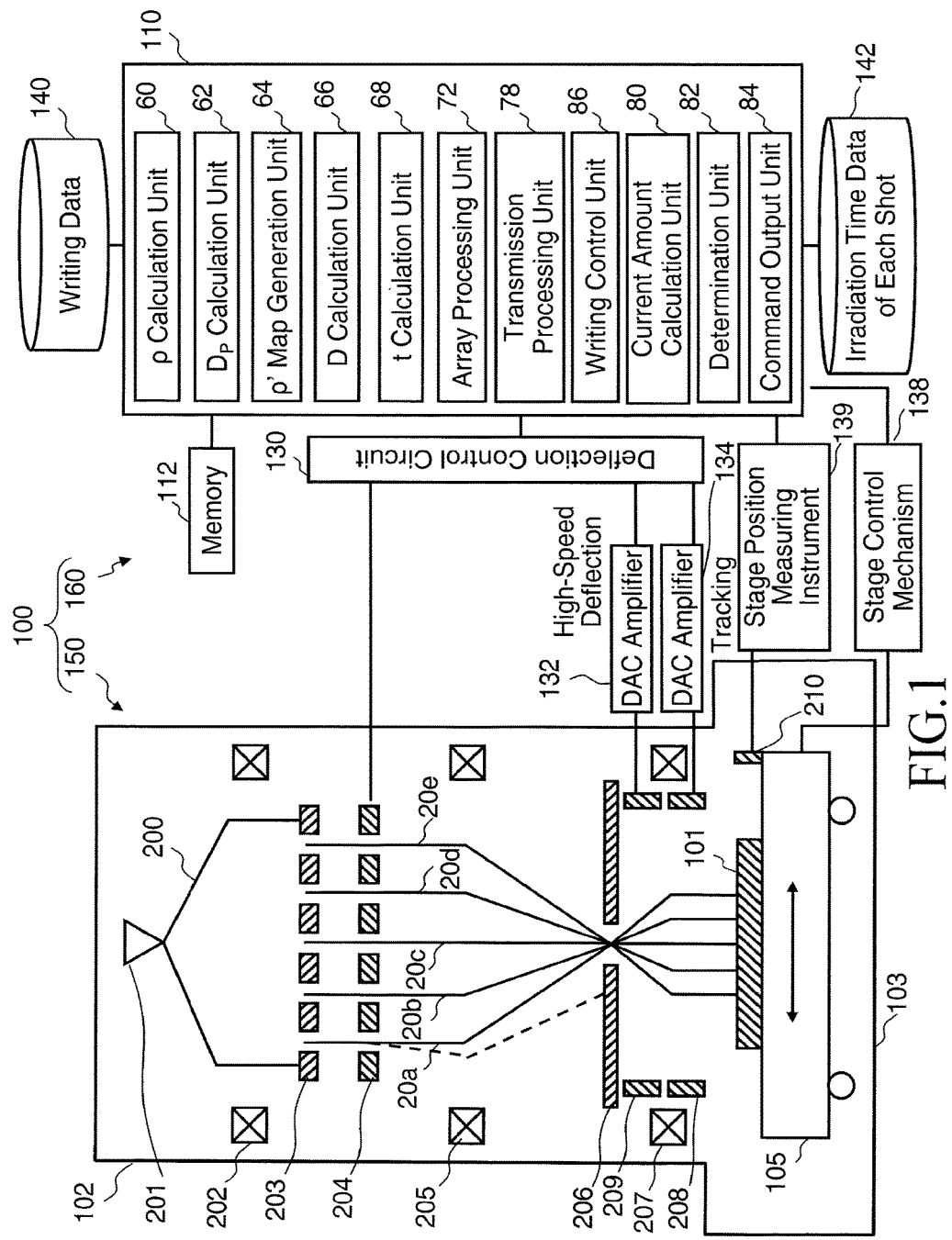
FIG. 1 is a conceptual diagram showing a configuration of a writing apparatus according to a first embodiment.

FIG. 1 is a conceptual diagram showing a configuration of a writing or "drawing" apparatus according to the first embodiment. As shown in FIG. 1, a writing apparatus 100 includes a writing unit 150 and a control system circuit 160. The writing apparatus 100 is an example of a multi charged particle beam writing apparatus and an example of a multi charged particle beam exposure apparatus. The writing unit 150 includes an electron optical column 102 and a writing chamber 103. In the electron optical column 102, there are arranged an electron gun 201, an illumination lens 202, a shaping aperture array member 203, a blanking aperture array mechanism 204, a reducing lens 205, a limiting aperture member 206, an objective lens 207, and deflectors 208 and 209. In the writing chamber 103, an XY stage 105 is arranged. On the XY stage 105, a target object or "sample" 101 such as a mask serving as a writing substrate is placed when writing (exposing) is performed. The target object 101 is, for example, an exposure mask used for manufacturing semiconductor devices, or a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The control system circuit 160 includes a control computer 110, a memory 112, a deflection control circuit 130, DAC (digital-analog converter) amplifier units 132 and 134, a stage control mechanism 138, a stage position measuring instrument 139, and storage devices 140 and 142 such as magnetic disk drives. The control computer 110, the memory 112, the deflection control circuit 130, the stage control mechanism 138, the stage position measuring instrument 139, and the storage devices 140 and 142 are connected with each other through a bus (not shown). Writing data is input from the outside of the writing apparatus 100 to the storage device 140 (storage unit), and stored therein. The deflection control circuit 130 is connected to the DAC amplifier units 132 and 134, and the blanking aperture array mechanism 204 through a bus (not shown). The stage position measuring instrument 139 irradiates the mirror 210 on the XY stage 105 with a laser beam, and receives a catoptric light from the mirror 210. Then, the stage position measuring instrument 139 measures the position of the XY stage 105 by using information of the catoptric light.

In the control computer 110, there are arranged a pattern area density ρ calculation unit 60, a proximity effect correction coefficient $D_p$ calculation unit 62, a pattern-areadensity-ρ'-in-pixel map generation unit 64, a dose D calculation unit 66, an irradiation time t calculation unit 68, an array processing unit 72, a transmission processing unit 78, a current amount calculation unit 80, a determination unit 82, a command output unit 84, and a writing control unit 86. Each of " . . . units" such as the pattern area density ρ calculation unit 60, the proximity effect correction coefficient $D_p$ calculation unit 62, the pattern-area-density-ρ'-in-pixel map generation unit 64, the dose D calculation unit 66, the irradiation time t calculation unit 68, the array processing unit 72, the transmission processing unit 78, the current amount calculation unit 80, the determination unit 82, the command output unit 84, and the writing control unit 86 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the pattern area density ρ calculation unit 60, the proximity effect correction coefficient $D_p$ calculation unit 62, the pattern-area-density-ρ'-in-pixel map generation unit 64, the dose D calculation unit 66, the irradiation time t calculation unit 68, the array processing unit 72, the transmission processing unit 78, the current amount calculation unit 80, the determination unit 82, the command output unit 84, and the writing control unit 86, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
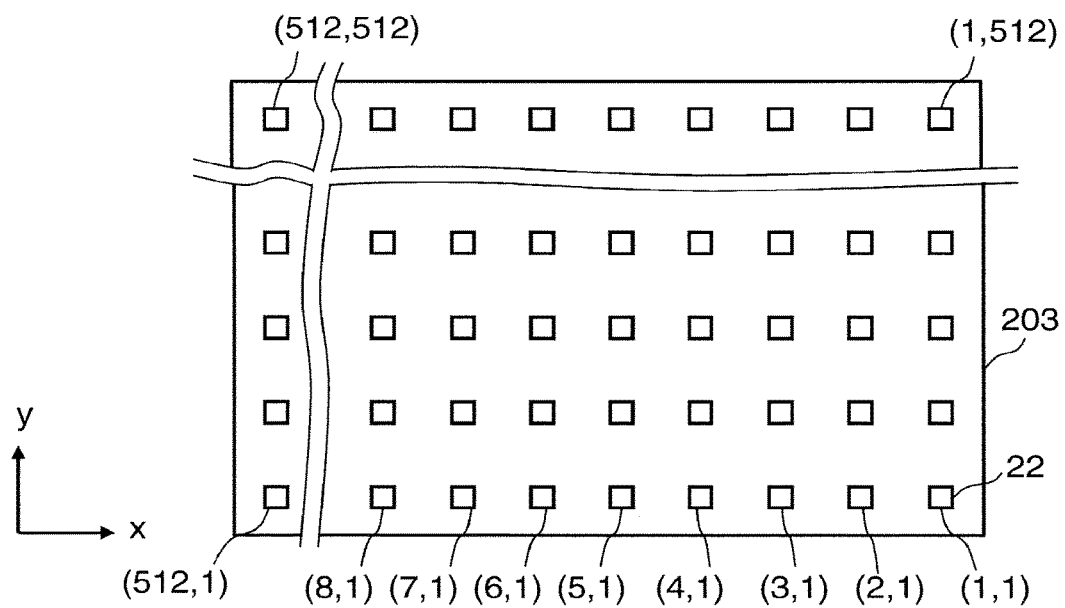
FIG. 2 is a conceptual diagram showing a configuration of a shaping aperture array member according to the first embodiment.

FIG. 2 is a conceptual diagram showing a configuration of a shaping aperture array member according to the first embodiment. As shown in FIG. 2, holes (openings) 22 of p rows long (y direction) and q columns wide (x direction) (p≥2, q≥2) are formed, like a matrix, at a predetermined arrangement pitch in the shaping aperture array member 203. In FIG. 2, for example, holes 22 of 512 (rows arrayed in the y direction)×512 (columns arrayed in the x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1) th row and each hole in the (k+2)th row may be mutually displaced in the width direction (x direction) by a dimension "b", for example.

Figure 3:
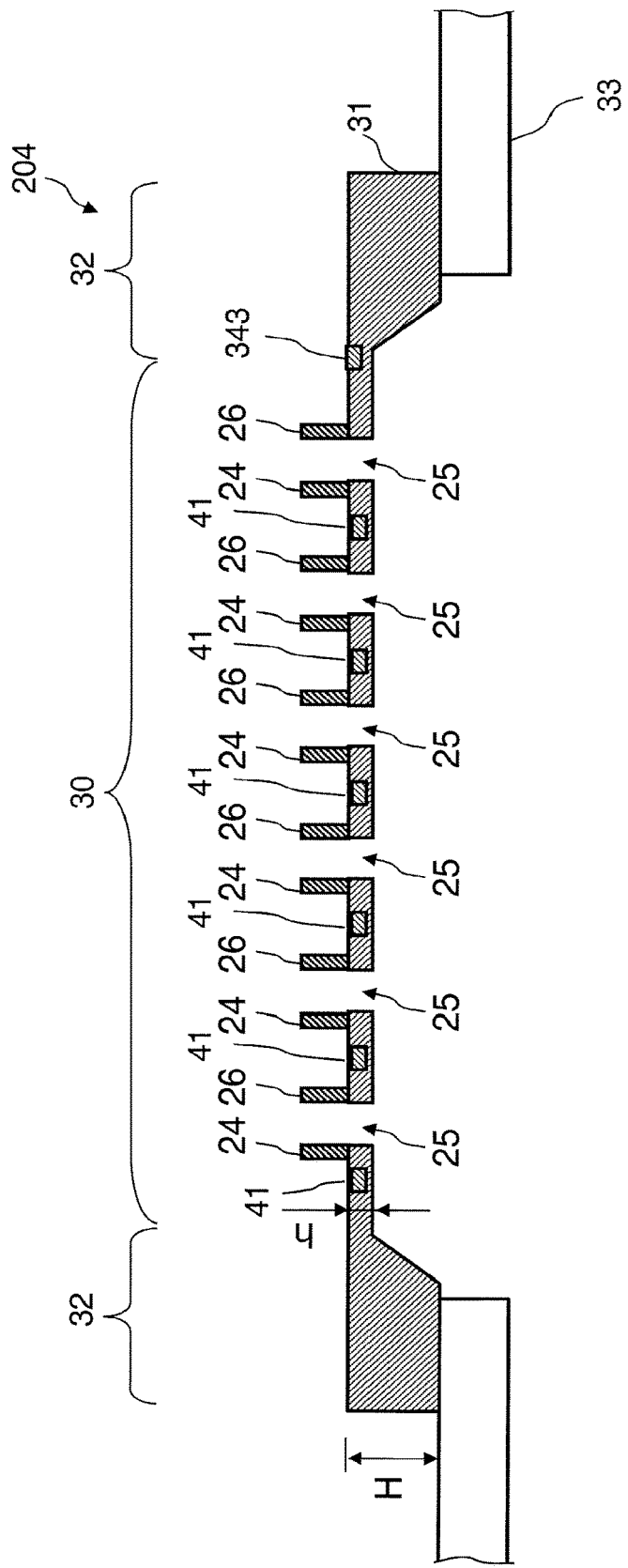
FIG. 3 is a sectional view showing a configuration of a blanking aperture array mechanism according to the first embodiment.
Figure 4:
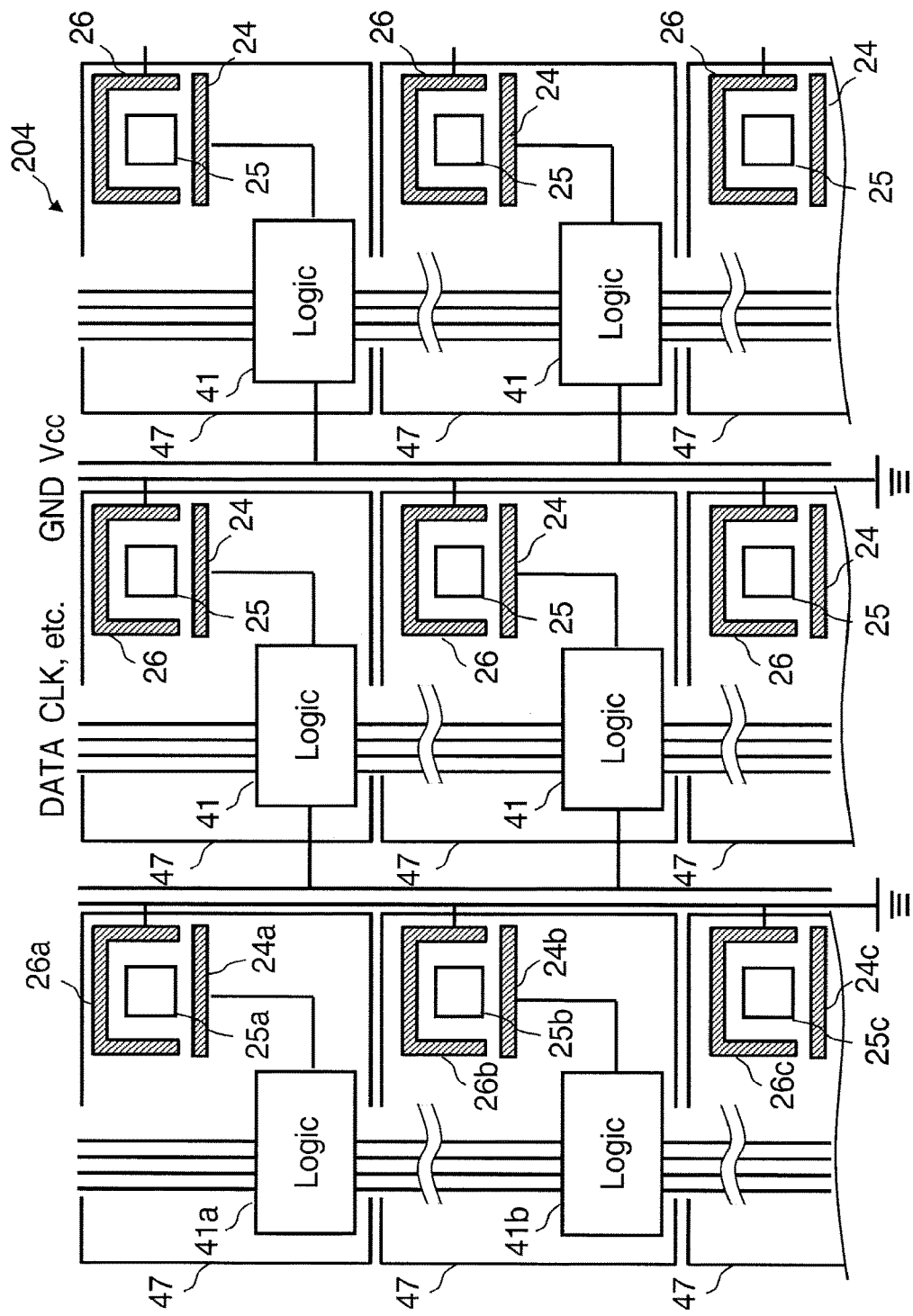
FIG. 4 is a top view conceptual diagram showing a part of the configuration in a membrane region of a blanking aperture array mechanism according to the first embodiment.

FIG. 3 is a sectional view showing the configuration of a blanking aperture array mechanism according to the first embodiment. FIG. 4 is a top view conceptual diagram showing a part of the configuration in a membrane region of a blanking aperture array mechanism according to the first embodiment. Between FIGS. 3 and 4, the positional relation among a control electrode 24, a counter electrode 26, a control circuit 41, and a pad 343 is not in accordance with each other. With regard to the configuration of the blanking aperture array mechanism 204, as shown in FIG. 3, a semiconductor substrate 31 made of silicon, etc. is placed on a support table 33. The central part of the substrate 31 is shaved from the back side and processed to be a membrane region 30 (first region) having a thin film thickness h. The circumference surrounding the membrane region 30 is a circumference region 32 (second region) having a thick film thickness H. The upper surface of the membrane region 30 and the upper surface of the circumference region 32 are formed to be at the same height position, or substantially at the same height position. At the backside of the circumference region 32, the substrate 31 is supported to be on the support table 33. The central part of the support table 33 is open, and the position of the membrane region 30 is located in the opening part of the support table 33.

In the membrane region 30, there are formed passage holes 25 (openings), through which multi-beams individually pass, at the positions corresponding to the holes 22 of the shaping aperture array member 203 shown in FIG. 2. In other words, in the membrane region 30 of the substrate 31, there are formed a plurality of passage holes 25 in an array through each of which a corresponding electron beam of multi-beams passes. Moreover, in the membrane region 30 of the substrate 31, a plurality of electrode pairs each composed of two electrodes arranged to be opposite each other with respect to a corresponding one of a plurality of passage holes 25. Specifically, in the membrane region 30, as shown in FIGS. 3 and 4, each pair of the control electrode 24 and the counter electrode 26 (blanker: blanking deflector) for blanking deflection is arranged close to a corresponding passage hole 25 in a manner such that the electrodes 24 and 26 are opposite each other with respect to the passage hole 25 concerned. Moreover, close to each passage hole 25 in the membrane region 30 of the substrate 31, there is arranged a control circuit 41 (logic circuit) for applying a deflection voltage to the control electrode 24 for the passage hole 25 concerned. The counter electrode 26 for each beam is grounded (earthed).

Moreover, as shown in FIG. 4, n-bit (e.g., 10-bit) parallel lines for control signals are connected to each control circuit 41. In addition to the n-bit parallel lines for controlling, clock signal lines, wiring lines for a power source, etc. are connected to each control circuit 41. A part of the parallel lines may be used as the clock signal lines and the power source wiring lines. An individual blanking mechanism 47 composed of the control electrode 24, the counter electrode 26, and the control circuit 41 is configured for each beam of the multi-beams. In the example of FIG. 3, the control electrode 24, the counter electrode 26, and the control circuit 41 are arranged in the membrane region 30 having a thin film thickness of the substrate 31. However, it is not limited thereto. A plurality of control circuits 41 formed in an array in the membrane region 30 are grouped by each row or each column, and the control circuits 41 in the same group are connected in series as shown in FIG. 4. A signal is transferred from the pad 343 arranged for each group to the control circuits 41 in the same group. Specifically, a shift register to be described later is arranged in each control circuit 41, and for example, shift registers in the control circuits for beams in the same row in p×q multiple beams, for example, are connected in series. For example, control signals for beams in the same row in the p×q multiple beams are transmitted in series. For example, a control signal for each beam is stored in a corresponding control circuit 41 by clock signals performed p times.

Figure 5:
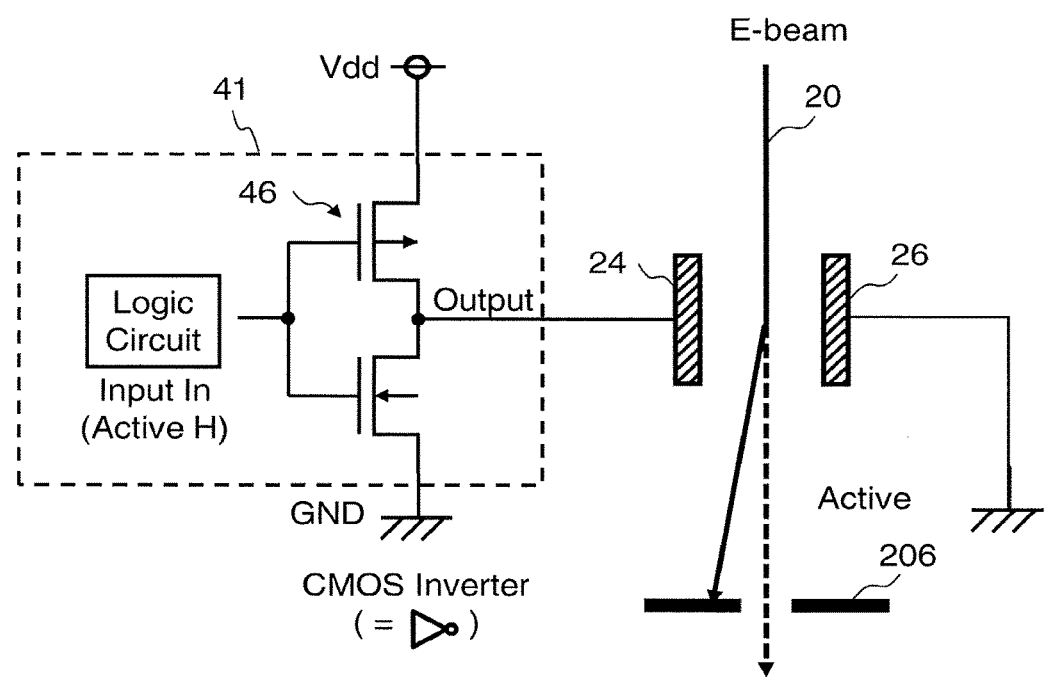
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that the control electrode 24 and the corresponding counter electrode 26 are opposite each other with respect to a corresponding one of a plurality of passage holes 25.

As the input (IN) of the CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in the state where an L electric potential is applied to the input (IN) of the CMOS inverter circuit, the output (OUT) of the CMOS inverter circuit becomes a positive potential (Vdd), and it is controlled to be beam OFF by deflecting a corresponding beam 20 by an electric field due to a potential difference against the ground potential of the counter electrode 26, and by performing blocking using the limiting aperture member 206. On the other hand, in the state (active state) where an H electric potential is applied to the input (IN) of the CMOS inverter circuit, the output (OUT) of the CMOS inverter circuit becomes a ground potential, and therefore, since there is no potential difference against the ground potential of the counter electrode 26, a corresponding beam 20 is not deflected. Accordingly, it is controlled to be beam ON by letting the beam pass through the limiting aperture member 206.

The electron beam 20 passing through a corresponding passage hole is independently deflected by a voltage applied to the control electrode 24 and the counter electrode 26 being a pair. Blanking control is performed by this deflection. Specifically, a pair of the control electrode 24 and the counter electrode 26 individually provides blanking deflection of a corresponding beam of multi-beams by an electric potential switched by the CMOS inverter circuit which serves as a corresponding switching circuit. Thus, each of a plurality of blankers performs blanking deflection of a corresponding beam of the multi-beams having passed through a plurality of holes 22 (openings) of the shaping aperture array member 203.

Figure 6:
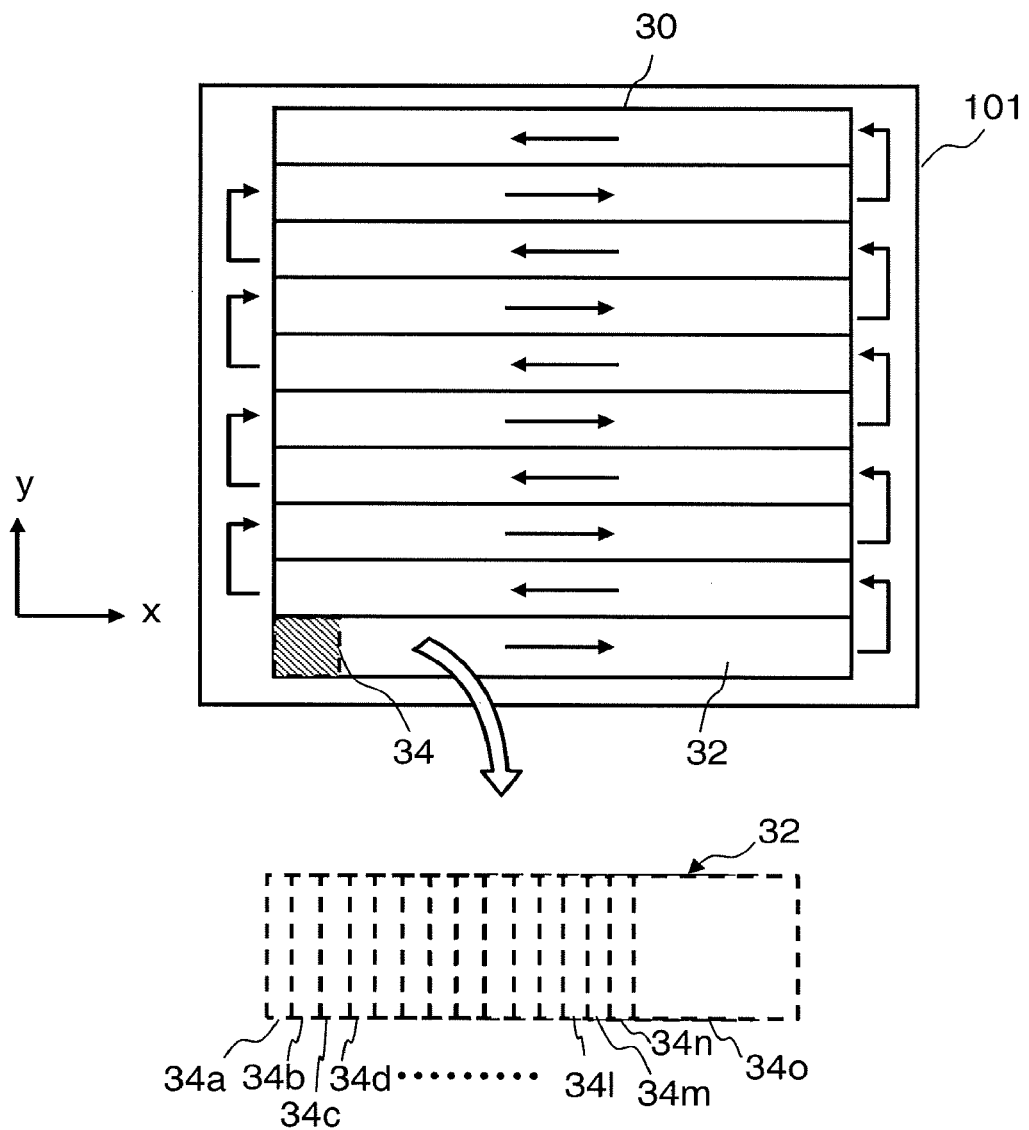
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width or "height" (to be a stripe width) in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 105 is moved, for example, in the −x direction, so that the writing advances relatively in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction. Then, by moving the XY stage 105 in the x direction, for example, writing similarly advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns, whose number is equal to the number of the holes 22 at the maximum, are formed at a time by one shot (total of irradiation steps to be described later) of multi-beams which have been formed by passing through each of the holes 22 of the shaping aperture array member 203.

Figure 7:
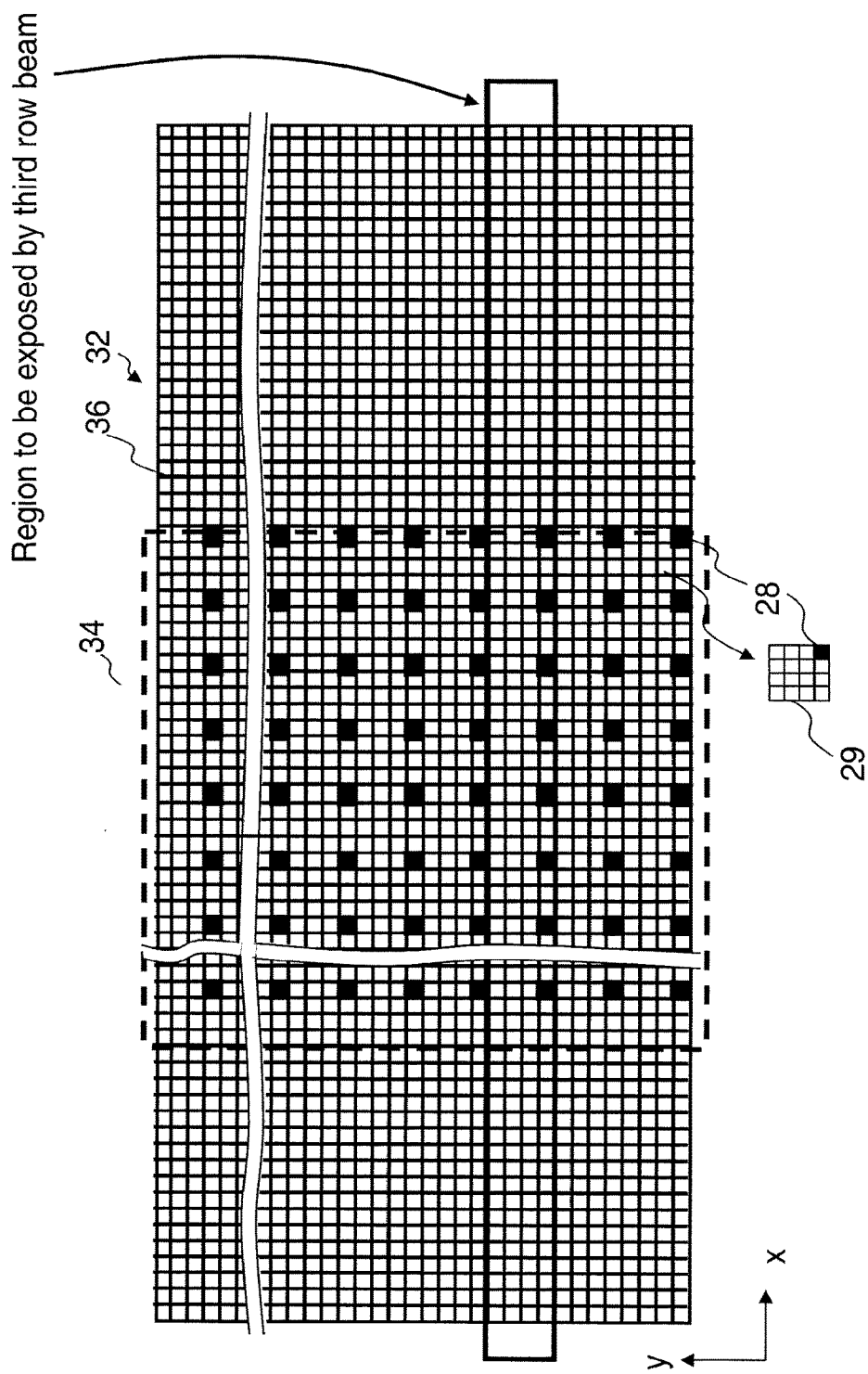
FIG. 7 shows an example of an irradiation region of multi-beams and a pixel to be written according to the first embodiment.

FIG. 7 shows an example of an irradiation region of multi-beams and a pixel to be written (writing pixel) according to the first embodiment. In FIG. 7, the stripe region 32 is divided into a plurality of mesh regions by the size of each beam of the multi-beams, for example. Each mesh region serves as a writing pixel 36 (unit irradiation region, or writing position). The size of the writing pixel 36 is not limited to the beam size, and it may be an arbitrary size regardless of the beam size. For example, it may be 1/n (n being an integer of 1 or more) of the beam size. FIG. 7 shows the case where the writing region of the target object 101 is divided in the y direction into a plurality of stripe regions 32 by the width size being substantially the same as the size of the irradiation region 34 (writing field) which can be irradiated by one time irradiation of the multi-beams 20, for example. The width of the stripe region 32 is not limited to this. It is also preferable for the width of the stripe region 32 to be n times (n being an integer of 1 or more) the size of the irradiation region 34. FIG. 7 shows the case of multi-beams of 512×512 (rows by columns). In the irradiation region 34, there are shown a plurality of pixels 28 (writing positions of beams) which can be irradiated by one shot of the multi-beams 20. In other words, the pitch between the adjacent pixels 28 is the pitch between beams of the multi-beams. In the example of FIG. 7, one grid 29 is a square region surrounded at four corners by four adjacent pixels 28, and including one of the four pixels 28. In the example of FIG. 7, each grid 29 is configured by 4×4 pixels.

Figure 8:
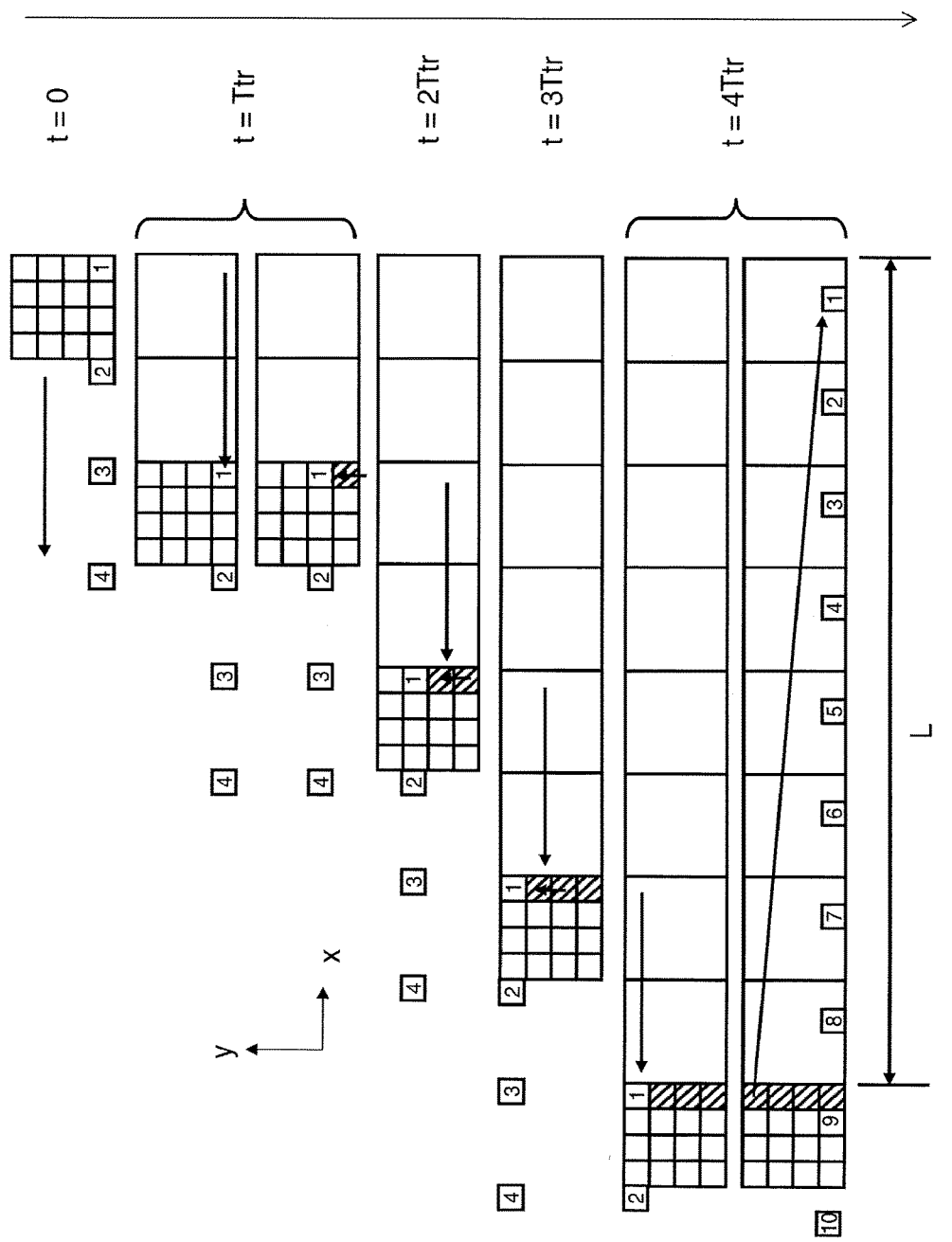
FIG. 8 illustrates an example of a writing method of multi-beams according to the first embodiment.

FIG. 8 illustrates an example of a writing method of multi-beams according to the first embodiment. FIG. 8 shows some grids to be written by respective beams at the coordinates (1, 3), (2, 3), (3, 3), . . . , (512, 3) in the third row from the bottom in the y direction in the multi-beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laxer and receiving a catoptric light from the mirror 210. The measured position of the XY stage 105 is output to the control computer 110. In the control computer 110, the writing control unit 86 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing unit 150 irradiates each pixel 36 with a corresponding beam in the ON state in the multi-beams 20 during a writing time (irradiation time or exposure time) corresponding to each pixel 36 within the maximum writing time Ttr of the irradiation time of each beam of the multi-beams of the shot concerned.

In the example of FIG. 8, during from the time t=0 to t=Ttr being the maximum writing time, using a beam (1) of coordinates (1, 3), beam irradiation of the first shot composed of a plurality of irradiation steps (multiple exposures) is performed to the first pixel from the right in the bottom row of the grid 29 concerned. The XY stage 105 moves, for example, two beam pitches in the −x direction during from the time t=0 to t=Ttr. During this time period, the tracking operation is continuously performed.

After the maximum writing time Ttr of the shot concerned has passed since the start of beam irradiation of the shot concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 8, when the time becomes t=Ttr, the pixel to be written (writing pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the ON state in the multi-beams 20 are applied to shifted writing positions corresponding to the respective beams during a writing time corresponding to each of the respective beams within a maximum writing time Ttr of the shot concerned. In the example of FIG. 8, the first pixel from the right in the second row from the bottom of the grid 29 concerned is irradiated by the second shot using the beam (1) of coordinates (1, 3) during the time from t=Ttr to t=2 Ttr, for example. The XY stage 105 moves two beam pitches in the −x direction during the time from t=Ttr to t=2 Ttr, for example. During this time period, the tracking operation is continuously performed.

In the example of FIG. 8, when the time becomes t=2 Ttr, the pixel to be written (writing pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) during the time from t=2 Ttr to t=3 Ttr, for example. The XY stage 105 moves two beam pitches in the −x direction during the time from t=2 Ttr to t=3 Ttr, for example. During this time period, the tracking operation is continuously performed. When the time becomes t=3 Ttr, the pixel to be written (writing pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) during the time from t=3 Ttr to t=4 Ttr, for example. The XY stage 105 moves two beam pitches in the −x direction during the time from t=3 Ttr to t=4 Ttr, for example. During this time period, the tracking operation is continuously performed. By the process described above, writing of the pixels in the first column from the right of the grid 29 concerned has been completed.

In the example of FIG. 8, after emitting a corresponding beam to the writing position of each beam which has been shifted three times from the initial position, the DAC amplifier 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4 Ttr, tracking of the grid 29 concerned is released (removed), and the beam is swung back to a new target grid which has been shifted by eight beam pitches in the x direction. Although the beam (1) of the coordinates (1,3) has been described in the example of FIG. 8, writing is also similarly performed for each grid corresponding to a beam of other coordinates. That is, a beam of coordinates (n, m) completes writing of pixels in the first column from the right of a corresponding grid when the time becomes t=4 Ttr. For example, a beam (2) of coordinates (2,3) completes writing of pixels in the first column from the right of a grid adjacent in the −x direction to the grid 29 concerned for the beam (1) of FIG. 8.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot is performed while shifting the irradiation position pixel by pixel by the deflector 209 in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 6, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34a to 34o, to perform writing of the stripe region concerned.

Figure 9:
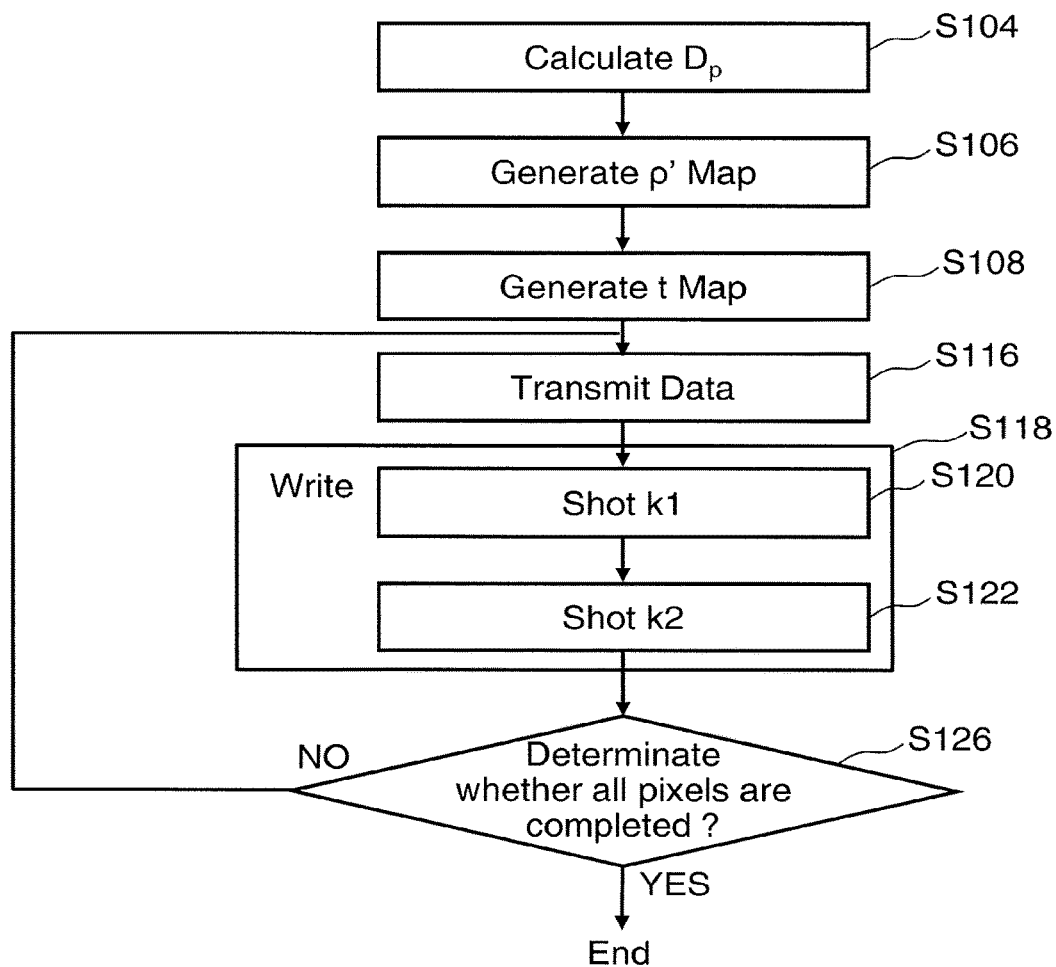
FIG. 9 is a flowchart showing main steps of a writing method according to the first embodiment.

FIG. 9 is a flowchart showing main steps of a writing method according to the first embodiment. As shown in FIG. 9, the writing method according to the first embodiment executes a series of steps: a proximity effect correction coefficient $D_p$ calculation step (S104), a pattern-area-density-$\rho'$-in-pixel map generation step (S106), an irradiation time t map generation step (S108), a data transmission step (S116), a writing step (S118), and a determination step (S126). The writing step (S118) performs a shot k1 step (S120) and a shot k2 step (S122) as internal steps.

In the proximity effect correction irradiation coefficient $D_p$ calculation step (S104), first, the $\rho$ calculation unit 60 virtually divides the writing region (here, for example, stripe region 32) into a plurality of proximity mesh regions (mesh regions for proximity effect correction calculation) by a predetermined size. The size of the proximity mesh region is preferably about 1/10 of the influence radius of the proximity effect, such as about 1 μm. The $\rho$ calculation unit 60 reads writing data from the storage device 140, and calculates, for each proximity mesh region, a pattern area density $\rho$ of a pattern arranged in the proximity mesh region concerned.

Next, the $D_p$ calculation unit 62 calculates, for each proximity mesh region, a proximity effect correction irradiation coefficient $D_p$ for correcting a proximity effect. Here, the size of the mesh region to calculate the proximity effect correction irradiation coefficient $D_p$ does not need to be the same as that of the mesh region to calculate a pattern area density $\rho$. Moreover, the correction model of the proximity effect correction irradiation coefficient $D_p$ and its calculation method may be the same as those used in the conventional single beam writing system.

In the pattern-area-density-$\rho'$-in-pixel map generation step (S106), the $\rho'$ generation unit 64 calculates, for each pixel 36, a pattern area density $\rho'$ in the pixel 36 concerned. The mesh size of $\rho'$ is set to be the same as the size of the pixel 28.

In the irradiation time t map generation step (S108), first, the D calculation unit 66 calculates, for each pixel (writing pixel) 36, a dose D with which the pixel 36 concerned is irradiated. The dose D can be calculated, for example, by multiplying a pre-set reference dose $D_{base}$, a proximity effect correction irradiation coefficient $D_p$, and a pattern area density $\rho'$. Thus, it is preferable to obtain the dose D to be in proportion to a pattern area density calculated for each pixel 36.

Next, the t calculation unit 68 calculates, for each pixel 36, an electron beam irradiation time t for making the calculated dose D incident on the pixel 36 concerned. The irradiation time t can be calculated by dividing the dose D by a current density J. Then, the irradiation time t map which defines the irradiation time t acquired for each pixel 36 is generated. The generated t map is stored in the storage device 142. According to the first embodiment, for example, a signal of the irradiation time t of each pixel 36 becomes an ON/OFF control signal of the pixel 36 concerned. Alternatively, a signal of a count value obtained by dividing the irradiation time t of each pixel 36 by a clock period becomes the ON/OFF control signal of the pixel 36 concerned.

Next, the array processing unit 72 processes the ON/OFF control signal (irradiation time t or count value) (also called irradiation time array data or shot data) in order of beam shot. As explained with reference to FIG. 8, the pixel 36 adjacent in the direction of stage movement is not necessarily shot subsequently. Therefore, here, the array processing unit 72 processes the order such that the ON/OFF control signal of each pixel 36 is arranged in order of pixel 36 to be shot by the multi-beams 20 sequentially in accordance with the writing sequence. Also, the array processing unit 72 processes the order such that the ON/OFF control signals are arranged in order of the shift registers 40 connected in series. The processed ON/OFF control signal is stored in the storage device 142.

In the data transmission step (S116), for each shot, the transmission processing unit 78 transmits, in a batch, the ON/OFF control signals each for the shot concerned to the deflection control circuit 130. For each shot, the deflection control circuit 130 transmits, in a batch, the ON/OFF control signals each for each beam of the multi-beams 20 to the blanking aperture array mechanism 204 (blanking apparatus). Specifically, for each shot, the deflection control circuit 130 transmits, in a batch, the ON/OFF control signals to the control circuits 41 each for each beam in the blanking aperture array mechanism 204.

Figure 10:
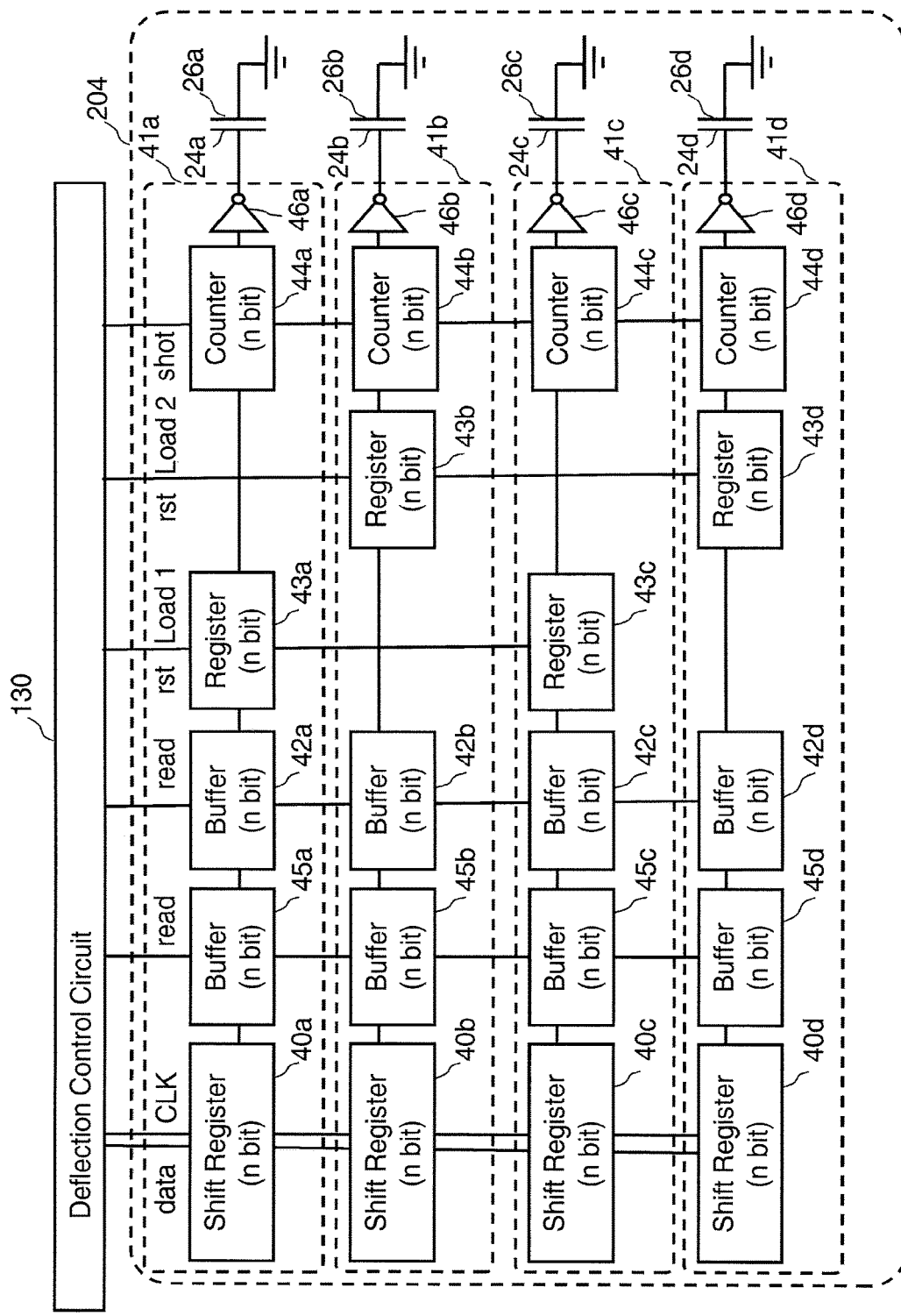
FIG. 10 is a schematic diagram showing the internal configuration of an individual blanking control circuit according to the first embodiment.

In the writing step (S118), the writing mechanism 150 irradiates the writing substrate 101 with the multi-beams 20 in accordance with the ON/OFF control signals each for each beam transmitted in a batch, while shifting the irradiation timing for each group obtained by grouping the multi-beams 20 into a plurality of groups by a plurality of individual blanking mechanisms 47 mounted in the blanking aperture array mechanism 204. Specifically, it operates as follows:

FIG. 10 is a schematic diagram showing the internal configuration of an individual blanking control circuit according to the first embodiment. As shown in FIG. 10, in each control circuit 41 for individual blanking control arranged in the blanking aperture array mechanism 204 inside the body of the writing apparatus 100, there are arranged a shift register 40, a buffer register 45, a buffer register 42, a register 43, a counter circuit 44, and an amplifier 46. According to the first embodiment, individual blanking control for each beam is performed by an n-bit (e.g., 10-bit) control signal. Here, for example, with respect to the multi-beams 20 composed of p×q beams in an array (matrix), the shift registers 40 in the control circuits 41 for p beams in the same row are connected in series. The example of FIG. 10 shows the case where the shift registers 40a, 40b, 40c, and 40d of the control circuits 41 for four beams in the same row are connected in series. According to the first embodiment, the multi-beams 20 of p×q beams are grouped into a plurality of groups. For example, they are alternately grouped into two groups according to the column. For example, beams in odd number columns in each row are in group 1, and beams in even number columns in each row are in group 2. The registers 43 (storage devices) in the same group are connected with each other. In other words, a plurality of registers 43 (storage devices) arranged inside the substrate 31 perform grouping of the multi-beams 20 into a plurality of groups. In the example of FIG. 10, with respect to control circuits 41a to 41d for four beams arranged in the same row, each having one of the shift registers 40a to 40d connected in series, the registers 43a and 43c are connected as being in the same group, and the registers 43b and 43d are connected as being in the same group. It is preferable to perform grouping such that adjacent beams belong to different groups. Thereby, the influence of the Coulomb effect from the adjacent beam can be eliminated. Then, according to the first embodiment, a plurality of registers 43 (storage devices) arranged inside the substrate 31 output ON/OFF control signals stored in the registers 43 concerned to the corresponding amplifiers 46 (switching circuits), while shifting the timing for each group. Hereinafter, it will be described specifically.

Figure 11:
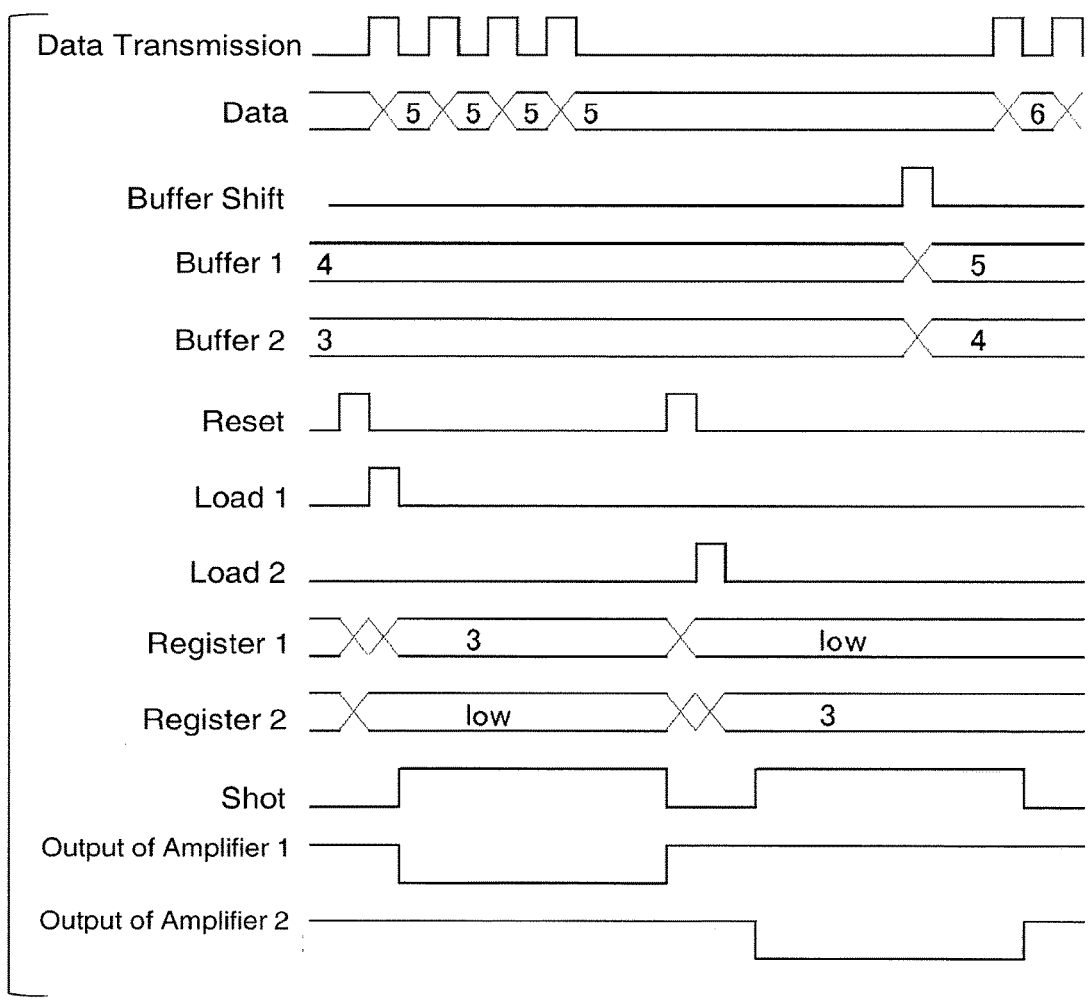
FIG. 11 shows transmission processing of an ON/OFF control signal for multi-beams and an operation in a control circuit according to the first embodiment.

FIG. 11 shows transmission processing of an ON/OFF control signal for multi-beams and an operation in a control circuit according to the first embodiment. As described above, according to the first embodiment, there are serially connected the shift registers 40a, 40b, 40c, 40d, and so on for p beams in the same row in the multi-beams 20 composed of p×q beams. Therefore, in one shot of the multi-beams, there are n-bit ON/OFF control signals grouped for each row of the multi-beams, where the number of the grouped ON/OFF control signals is the number of columns of the multi-beams. Such data group is transmitted in a batch to the blanking aperture array mechanism 204 from the deflection control circuit 130, for each shot of the multi-beams. For example, the data groups are parallelly transmitted in a batch. When the ON/OFF control signals for the (k+2)th shot are transmitted in a batch, for example, the ON/OFF control signal of each beam is stored in the corresponding shift register 40 by clock signals performed p times, for example. The example of FIG. 11 shows the case where the ON/OFF control signals of the fifth shot are transmitted in a batch. In the case of FIG. 10, the ON/OFF control signals of four beams are stored in the corresponding shift registers 40a, 40b, 40c, and 40d by clock signals performed four times.

The ON/OFF control signals for the (k+1)th shot have been stored in a buffer register 45a (buffer 1) for each beam at the time when the ON/OFF control signals of the (k+2)th shot are being transmitted in a batch. Moreover, at the same period, the ON/OFF control signals for the k-th shot have been stored in a buffer register 42a (buffer 2) for each beam. In the case of FIG. 11, the ON/OFF control signals for the last (previous, most recent) shot, that is the fourth shot, haven been stored in the buffer register 45a (buffer 1) for each beam at the time when the ON/OFF control signals for the fifth shot are being transmitted in a batch. The ON/OFF control signals for the last-but-one shot, that is the third shot, have been stored in the buffer register 42a (buffer 2) for each beam. In other words, the ON/OFF control signals for each beam of the multi-beams 20 transmitted in a batch to the blanking aperture array mechanism 204 (blanking apparatus) are individually temporarily stored in the corresponding buffer register 45 in a plurality of buffer registers 45 (an example of the first storage device) in the blanking aperture array mechanism 204. Similarly, the ON/OFF control signals for respective beams of the multi-beams 20 transmitted in a batch to the blanking aperture array mechanism 204 (blanking apparatus) are individually temporarily stored in the corresponding buffer register 42 in a plurality of buffer registers 42 (another example of the first storage device) in the blanking aperture array mechanism 204.

While the ON/OFF control signals for the (k+2)th shot are being transmitted in a batch, a reset signal is output to each register 43 from the deflection control circuit 130. Thereby, the ON/OFF control signals stored in the registers 43 for all the beams are eliminated.

Next, in the shot k1 step (S120), first, the deflection control circuit 130 outputs a read 1 signal (load 1) of the group 1 to the register 43 of the group 1. Accordingly, the ON/OFF control signal for the k-th shot stored in the buffer register 42a (buffer 2) is read into the register 43 (register 1) of the group 1. On the other hand, since the registers 43 (register 2) of the group 2 have been in a reset state, the ON/OFF control signal for the shot is not read. Therefore, in such a state, the ON/OFF control signals for the k-th shot (third shot in the example of FIG. 11) have been stored only in the registers 43 (register 1) of the group 1.

Next, the deflection control circuit 130 outputs first shot signals (for group 1) to the counter circuits 44 of all the beams. Accordingly, the counter circuit 44 for each beam outputs a beam ON signal to the amplifier 46 only during the time indicated by the ON/OFF control signal stored in the register 43 for the beam concerned. Specifically, the number of counts equivalent to the irradiation time of the beam concerned indicated by the ON/OFF control signal is counted by the clock cycle. Then, only during the counting, the input of the CMOS inverter circuit (amplifier 46) is made to be H (active). After the time indicated by the ON/OFF control signal has passed, a beam OFF signal is output to the amplifier 46. Specifically, after completing the counting, the input of the CMOS inverter circuit (amplifier 46) is made to be L. Here, since the ON/OFF control signals for the k-th shot have been stored in the registers 43 of the group 1, the counter circuits 44 of the group 1 output beam ON signals to the amplifiers 46 only during the time indicated by the ON/OFF control signals. On the other hand, since the ON/OFF control signals for the k-th shot have not been stored in the registers 43 of the group 2, the counter circuits 44 of the group 2 output beam OFF signals to the amplifiers 46.

Therefore, the amplifier 46 of the group 1 makes the beam concerned pass through the limiting aperture 206 without deflecting it, by applying a ground potential to the control electrode 24 only while the beam ON signal is input from the counter circuit 44. On the other hand, since no beam ON signal is input from the counter circuit 44, the amplifier 46 of the group 2 blocks the beam concerned by the limiting aperture 206 by providing blanking deflection to the beam concerned, by applying a positive electric potential (Vdd) to the control electrode 24. Thereby, the k-th shot (shot k1) of the group 1 is performed. With this shot k1, the writing mechanism 150 specifically operates as described below.

The electron beam 200 emitted from the electron gun 201 (emitter) almost perpendicularly (e.g., vertically) illuminates the whole of the shaping aperture array member 203 by the illumination lens 202. A plurality of quadrangular holes 22 (openings) are formed in the shaping aperture array member 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the shaping aperture array member 203. The multi-beams 20a. to 20e individually pass through corresponding blankers (pair of the control electrode 24 and the counter electrode 26) (first deflector: individual blanking mechanism 47) of the blanking aperture array mechanism 204. The blanker provides blanking control such that at least the electron beam 20 passing individually becomes in an ON state during the set writing time (irradiation time). Here, only the beams of the group 1 become in the ON state during the writing time (irradiation time).

The multi-beams 20a to 20e having passed through the blanking aperture array mechanism 204 are reduced by the reducing lens 205, and go toward the hole in the center of the limiting aperture member 206. At this stage, the electron beam 20 which was deflected by the blanker of the blanking aperture array mechanism 204 deviates from the hole in the center of the limiting aperture member 206 (blanking aperture member) and is blocked by the limiting aperture member 206. On the other hand, the electron beam 20 which was not deflected by the blanker of the blanking aperture array mechanism 204 passes through the hole in the center of the limiting aperture member 206 as shown in FIG. 1. Thus, the limiting aperture member 206 blocks each beam which was deflected to be the OFF state by the individual blanking mechanism 47. Then, each beam of one shot is formed by a beam made during a period from becoming ON to becoming OFF and having passed through the limiting aperture member 206. The multi-beams 20 having passed through the limiting aperture member 206 are focused by the objective lens 207 so as to be a pattern image of a desired reduction ratio. Beams (the whole of the multi-beams 20) having individually passed through the limiting aperture member 206 are collectively deflected in the same direction by the deflectors 208 and 209 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes 22 of the shaping aperture array member 203 by a desired reduction ratio described above.

After the shot of the group 1, (shot 1), has been completed, while the ON/OFF control signals of the (k+2) th shot are transmitted in a batch, the deflection control circuit 130 outputs a reset signal to each register 43. Thereby, the ON/OFF control signals stored in the registers 43 for all the beams are eliminated.

Next, in the shot k2 step (S122), first, the deflection control circuit 130 outputs a read 2 signal (load 2) of the group 2 to the register 43 of the group 2. Accordingly, the ON/OFF control signal for the k-th shot stored in the buffer register 42a (buffer 2) is read into the register 43 (register 2) of the group 2. On the other hand, since the register 43 (register 1) of the group 1 has been in a reset state, the ON/OFF control signal for the shot is not read. Therefore, in such a state, the ON/OFF control signals for the k-th shot (third shot in the example of FIG. 11) have been stored only in the register 43 (register 2) of the group 2.

Next, the deflection control circuit 130 outputs second shot signals (for group 2) to the counter circuits 44 of all the beams. Accordingly, the counter circuit 44 for each beam outputs a beam ON signal to the amplifier 46 only during the time indicated by the ON/OFF control signal stored in the register 43 for the beam concerned. Since the ON/OFF control signals for the k-th shot are stored in the registers 43 of the group 2, the counter circuits 44 of the group 2 output beam ON signals to the amplifiers 46 only during the time indicated by the ON/OFF control signals. On the other hand, since the ON/OFF control signals for the k-th shot are not stored in the registers 43 of the group 1, the counter circuits 44 of the group 1 output beam OFF signals to the amplifiers 46.

Therefore, the amplifier 46 of the group 2 makes the beam concerned pass through the limiting aperture 206 without deflecting it, by applying a ground potential to the control electrode 24 only while the beam ON signal is input from the counter circuit 44. On the other hand, since no beam ON signal is input from the counter circuit 44, the amplifier 46 of the group 1 blocks the beam concerned by the limiting aperture 206 by providing blanking deflection to the beam concerned, by applying a positive electric potential (Vdd) to the control electrode 24. Thereby, the k-th shot (shot k2) of the group 2 is performed. The operation of the writing mechanism 150 is the same as what is described above. However, in this case, only the beams of the group 2 become in an ON state during the set irradiation time.

In other words, with respect to ON/OFF control signals for multi-beams having been transmitted in a batch and stored in a plurality of buffer registers 42, ON/OFF control signals for some beams (group 1) of the multi-beams are temporarily stored in a plurality of registers 43 (second storage devices) of the group 1 in the blanking aperture array mechanism 204. Moreover, with respect to the ON/OFF control signals for the multi-beams having been transmitted in a batch and stored in a plurality of buffer registers 42, ON/OFF control signals for the other beams (group 2) except the some beams of the group 1 are temporarily stored in a plurality of registers 43 (third storage devices) of the group 2 in the blanking aperture array mechanism 204 at the time shifted from the storing timing of a plurality of registers 43 of the group 1. Then, the state that information stored in a plurality of registers 43 (third storage devices) of the group 2 has been reset is maintained during a period in which the ON/OFF control signals for some beams (group 1) are stored in a plurality of registers 43 (second storage devices) of the group 1. By contrast, the state that information stored in a plurality of registers 43 of the group 1 has been reset is maintained during a period in which the ON/OFF control signals for the other beams (group 2) except for the beams of the group 1 are stored in a plurality of registers 43 (third storage devices) of the group 2. Then, stored information is read from a plurality of registers 43 of the group 1 and a plurality of registers 43 of the group 2 in the state where the ON/OFF control signals for the some beams (group 1) are stored in a plurality of registers 43 (second storage devices) of the group 1, and information stored in a plurality of registers 43 of the group 2 has been reset. By this, only a plurality of registers 43 of the group 1 which are not reset can output beam ON/OFF control signals. Similarly, stored information is read from a plurality of registers 43 of the group 1 and a plurality of registers 43 of the group 2 in the state where the ON/OFF control signals for the other beams (group 2) except the beams of the group 1 are stored in a plurality of registers 43 of the group 2, and information stored in a plurality of registers 43 of the group 1 has been reset. By this, only a plurality of registers 43 of the group 2 which are not reset can output the beam ON/OFF control signals.

As described above, a plurality of CMOS inverter circuits (amplifiers 46) (an example of a switching circuit) for the multi-beams 20 are arranged inside the substrate 31, individually connected to a plurality of registers 43, and each switches the electric potential of binary values in accordance with the ON/OFF control signal stored in the corresponding register 43. Then, during the ON/OFF control signal being transmitted, the CMOS inverter circuit continuously performs shots k1 and k2 of each group while shifting the irradiation timing.

After the load 2 signal has been output and the ON/OFF control signals for the (k+2)th shot have been transmitted in a batch, the deflection control circuit 130 outputs buffer shift signals to the buffer registers 45 and 42. By this, the ON/OFF control signals for the (k+2)th shot stored in the shift registers 40 are shifted to the buffer registers 45 (buffer 1) for respective beams. Simultaneously, the ON/OFF control signals for the (k+1)th shot stored in the buffer registers 45 are shifted to the buffer registers 42 (buffer 2) for respective beams.

After the buffer shift signal has been output, ON/OFF control signals for the next (k+3)th shot are begun to be transmitted in a batch. Hereinafter, it is repeated similarly.

Thus, storage devices, such as the shift registers 40, the buffer registers 45, the buffer registers 42, and the registers 43 are arranged inside the substrate 31, and temporarily store the respective ON/OFF control signals for the multi-beams 20 transmitted in a batch. Specifically, a plurality of registers 43 (storage device) for the multi-beams 20 perform grouping of the multi-beams 20, and temporarily store the respective ON/OFF control signals for the multi-beams 20 transmitted in a batch.

FIG. 10 illustrates the case where the current shot is performed while a data transmission for the shot after the next one is being performed using the two buffer registers 45 and 42. However, it is not limited thereto. It is also acceptable that the current shot is performed while a data transmission for the next shot is being performed using the one buffer register 42. In either case, shots to be performed during data transmission should be completed within the data transmission while shifting the shot timing for each group.

As described above, according to the first embodiment, it is not necessary to divide data transmission for each group. Therefore, degradation of the throughput can be inhibited. Moreover, according to the first embodiment, the ON/OFF control signal to be transmitted has no information to identify the group for which shot timing should be shifted. Nonetheless, as shown in FIGS. 10 and 11, by the circuit configuration in the blanking aperture array mechanism 204, beam irradiation is performed based on data having been transmitted for the same shot, while shifting the irradiation timing of the same shot for each group. Thereby, it becomes unnecessary to define special information in the ON/OFF control signal. Moreover, according to the first embodiment, it is unnecessary to perform controlling while particularly identifying beam groups by the control mechanism, such as the control computer 110 and the deflection control circuit 130.

In the determination step (S126), the writing control unit 86 determines whether the writing processing for all the pixels 36 has been completed. If the writing processing for all the pixels 36 has been completed, the flow is finished. If the writing processing for all the pixels 36 has not been completed yet, it returns to the data transmission step (S116), and repeats each step after the data transmission step (S116).

Figure 12:
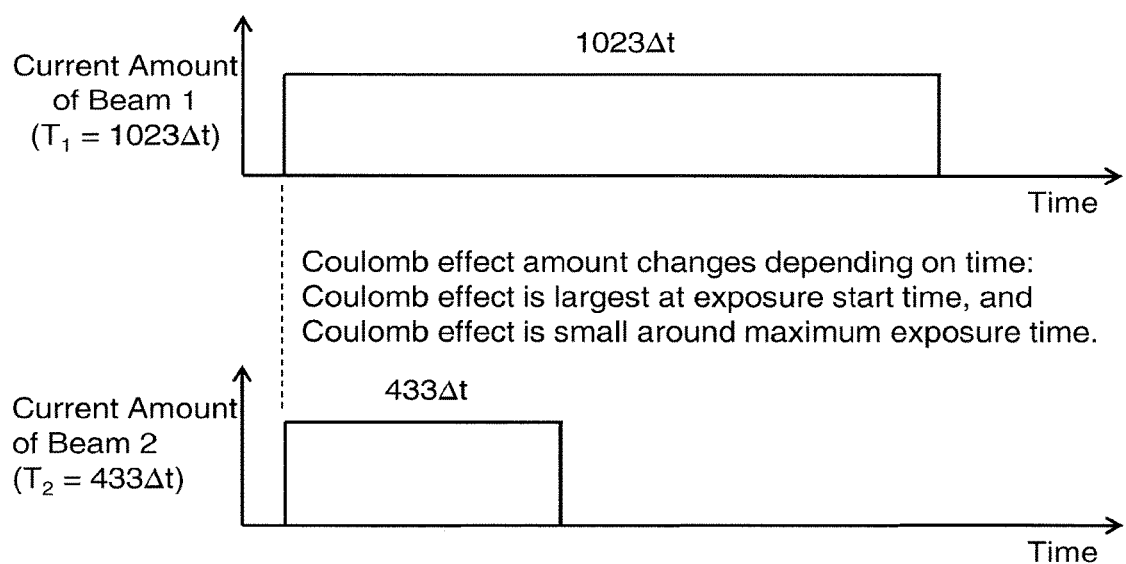
FIG. 12 illustrates a relation between a beam shot and a Coulomb effect according to a comparative example of the first embodiment.

FIG. 12 illustrates a relation between a beam shot and a Coulomb effect according to a comparative example of the first embodiment. The comparative example of the first embodiment shows the case where, for each shot, irradiation of the whole multi-beams 20 is performed at the same irradiation timing. In such a case, since the irradiation time differs depending on each beam, the influence of Coulomb effect is greatest at the time of starting irradiation (exposure). On the other hand, since a part of beam irradiation has already been finished at around the maximum exposure time, the influence of Coulomb effect becomes small there. Accordingly, it is desirable to lower the total current amount of all the beams at the time of starting irradiation (exposure). According to the first embodiment, since the multi-beams 20 is divided into a plurality of groups, and, at each shot time, the irradiation timing is shifted for each group, the total current amount of beams of each group at the time of staring irradiation (exposure) can be smaller than the total current amount of the whole of the multi-beams 20 at the staring time of simultaneous irradiation (exposure). Therefore, the influence of Coulomb effect can be reduced. Moreover, since data transmission for each shot can be completed by one time transmission, degradation of the throughput due to increase of transmission time can be avoided.

Figure 13:
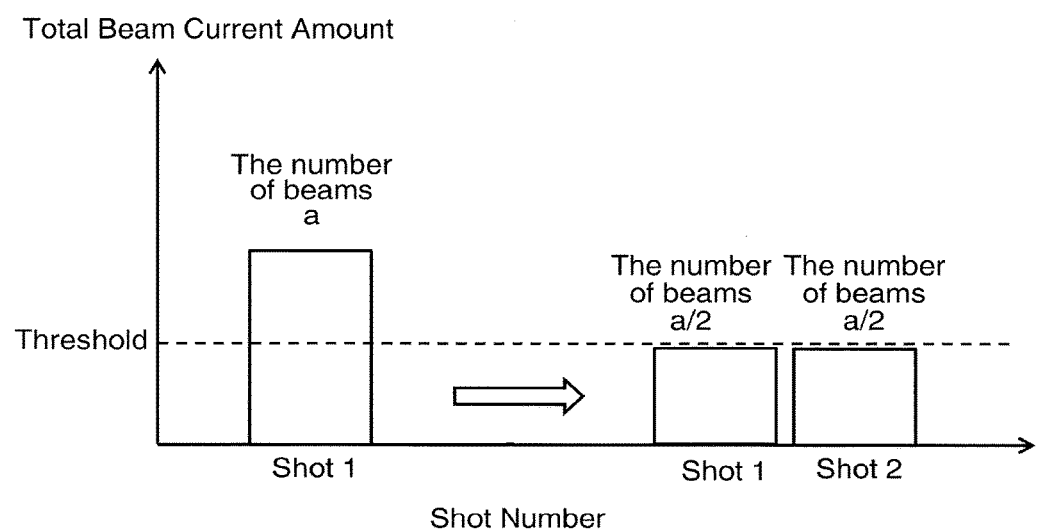
FIG. 13 shows an example of a modification of a group dividing method of multi-beams according to the first embodiment.

FIG. 13 shows an example of a modification of the group dividing method of multi-beams according to the first embodiment. In the example described above, the irradiation of the group 1 and the irradiation of the group 2 are performed irrespective of the current amount of the whole multi-beams in each shot. However, it is not limited thereto. As shown in FIG. 13, with respect to shots of the multi-beams 20, which are shots performed at the same time and whose total beam current amount exceeds a threshold, irradiation of the multi-beams 20 is performed in accordance with the ON/OFF control signals of respective beams transmitted in a batch, while shifting the irradiation timing for each group. On the other hand, with respect to shots of the multi-beams 20, which are shots performed at the same time and whose total beam current amount does not exceed the threshold, irradiation of the multi-beams 20 is performed in accordance with the ON/OFF control signals of respective beams transmitted in a batch, without shifting the irradiation timing for each group. Hereinafter, it will be described specifically.

In a current amount calculation step, after arranging the order of the ON/OFF control signal of each pixel 36 such that the ON/OFF control signals are aligned in order of the pixel 36 to be shot by the multi-beams 20 in accordance with the writing sequence, the current amount calculation unit 80 calculates, for each shot, the current amount of the whole multi-beams 20 of the shot concerned.

In a determination step, the determination unit 82 determines whether the calculated current amount of the whole multi-beams 20 of the shot concerned exceeds a threshold or not.

In a command output step, in the case where the calculated current amount of the whole multi-beams 20 of the shot concerned exceeds the threshold, the command output unit 84 outputs an identifiable signal 1 (command 1) indicating to shift the irradiation timing to the deflection control circuit 130 when transmitting the ON/OFF control signal for the shot concerned to the deflection control circuit 130. In the case where the calculated current amount of the whole multi-beams 20 of the shot concerned does not exceed the threshold, the command output unit 84 outputs an identifiable signal 2 (command 2) indicating not to shift the irradiation timing to the deflection control circuit 130 when transmitting the ON/OFF control signal for the shot concerned to the deflection control circuit 130.

When the command 1 is output to the deflection control circuit 130, as described above, with respect to shots of the multi-beams 20, which are shots performed at the same time and whose total beam current amount exceeds a threshold, the ON/OFF control signal stored in each register 43 is output to a corresponding CMOS inverter circuit while shifting the output timing for each group. Therefore, after the k-th shot (shot k1) of the group 1, the k-th shot (shot k2) of the group 2 is performed. On the other hand, when the command 2 is output to the deflection control circuit 130, it operates as follows:

In the shot k1 step (S120), first, the deflection control circuit 130 outputs a read 1 signal (load 1) of the group 1 to the register 43 of the group 1. At the same moment, the deflection control circuit 130 outputs a read 2 signal (load 2) of the group 2 to the register 43 of the group 2. By this, as shown in FIG. 11, the ON/OFF control signal for the k-th shot stored in the buffer register 42*a* (buffer 2) is read into the register 43 (register 1) of the group 1. Similarly, the ON/OFF control signal for the k-th shot stored in the buffer register 42a (buffer 2) is read into the register 43 (register 2) of the group 2. Therefore, in such a state, the ON/OFF control signals for the k-th shot (third shot in the example of FIG. 11) have been stored not only in the register 43 (register 1) of the group 1 but also in the register 43 (register 2) of the group 2.

Next, the deflection control circuit 130 outputs first shot signals (for group 1) to the counter circuits 44 of all the beams. The shot signals here can be used for the group 2 in addition to for the group 1. Accordingly, the counter circuit 44 for each beam outputs a beam ON signal to the amplifier 46 only during the time indicated by the ON/OFF control signal stored in the register 43 for the beam concerned. In such a case, since the ON/OFF control signals for the k-th shot have been stored in the registers 43 of the group 1, the counter circuits 44 of the group 1 output beam ON signals to the amplifiers 46 only during the time indicated by the ON/OFF control signals. Similarly, since the ON/OFF control signals for the k-th shot have been stored in the registers 43 of the group 2, the counter circuits 44 of the group 2 output beam ON signals to the amplifiers 46 only during the time indicated by the ON/OFF control signals.

Therefore, the amplifiers 46 of the groups 1 and 2 make the beams concerned pass through the limiting aperture 206 without deflecting them, by applying a ground potential to the control electrode 24 only while the beam ON signal is input from the counter circuit 44. Thereby, with respect to shots whose total beam current amount does not exceed a threshold, the ON/OFF control signal stored in each register 43 is output to a corresponding CMOS inverter circuit without shifting the output timing for each group. Accordingly, in parallel to the k-th shot (shot k1) of the group 1, the k-th shot (shot k2) of the group 2 is performed.

In such a case, since it is not necessary to perform the shot k2 after the shot k1, shifting to the next (k+1)th shot can be performed.

The example described above, as shown in FIG. 10, explains the case where beams in odd number columns in each row are in group 1, and beams in even number columns in each row are in group 2. However, the method of grouping is not limited thereto.

Figures 14A, 14B:
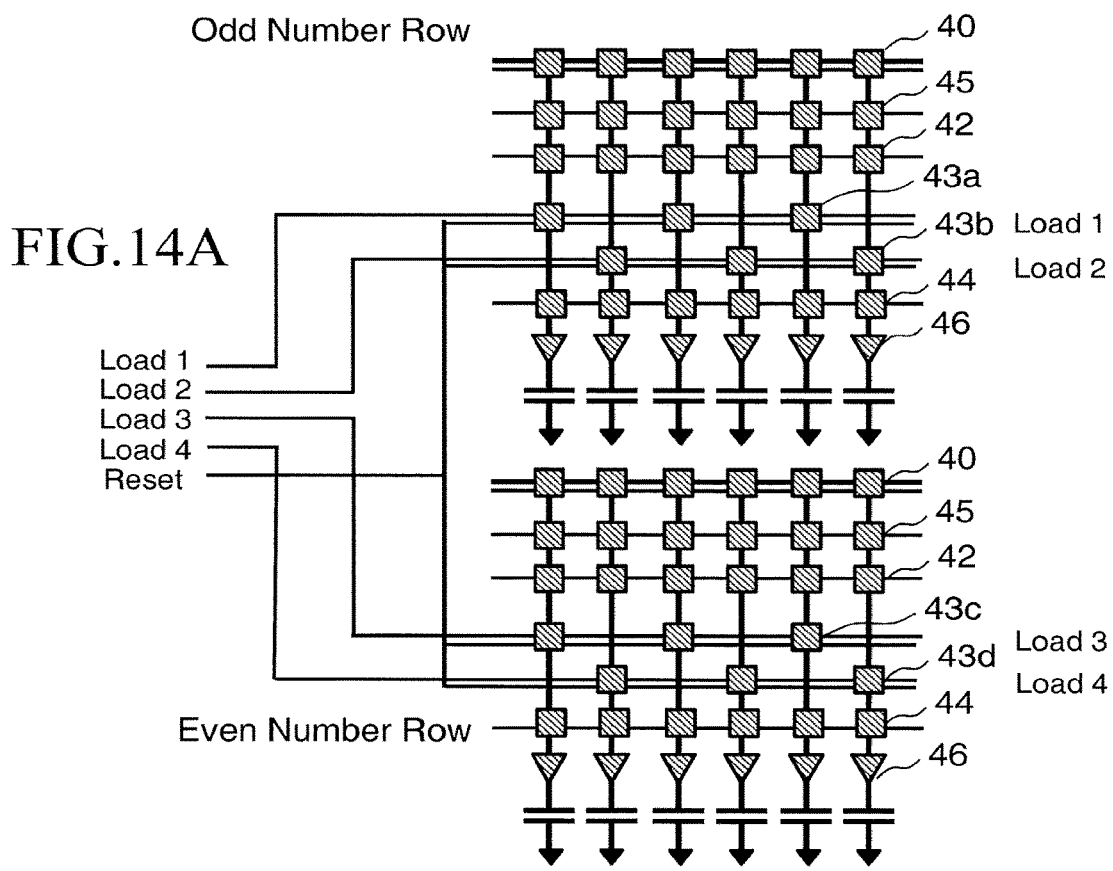
FIGS. 14A and 14B are conceptual diagrams showing another example of the internal configuration of the individual blanking control circuit, and an example of the beam group according to the first embodiment.

FIGS. 14A and 14B are conceptual diagrams showing another example of the internal configuration of the individual blanking control circuit, and an example of the beam group according to the first embodiment. As shown in FIG. 14A, for example, with respect to beams in odd number rows, beams in odd number columns of the odd number rows are in group 1, and beams in even number columns of the odd number rows are in group 2. Moreover, with respect to beams in even number rows, beams in odd number columns of the even number rows are in group 3, and beams in even number columns of the even number rows are in group 4. In such a case, irradiation of multi-beams is performed, for example, in order of the group 1, group 2, group 3, and group 4 while shifting the irradiation timing. Thereby, in such a case in FIG. 11, the deflection control circuit 130 outputs control signals in order of a reset signal, read 1 signal (load 1), shot signal, reset signal, read 2 signal (load 2), shot signal, reset signal (not shown), read 3 signal (load 3) (not shown), shot signal (not shown), reset signal (not shown), read 4 signal (load 4) (not shown), and shot signal (not shown). That is, it is more preferable, as shown in FIG. 14B, to perform grouping such that adjacent beams in the row and column directions belong to different groups. Accordingly, the influence of the Coulomb effect from the adjacent beam can further be eliminated than the case of being adjacent only in the row direction or column direction.

Figure 15A:
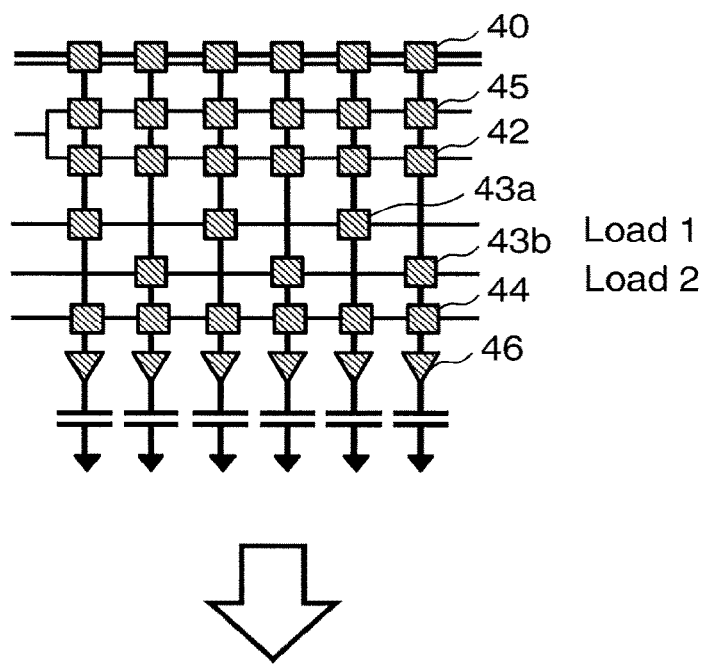
FIGS. 15A and 15B are conceptual diagrams showing another example of the internal configuration of the individual blanking control circuit according to the first embodiment.
Figure 15B:
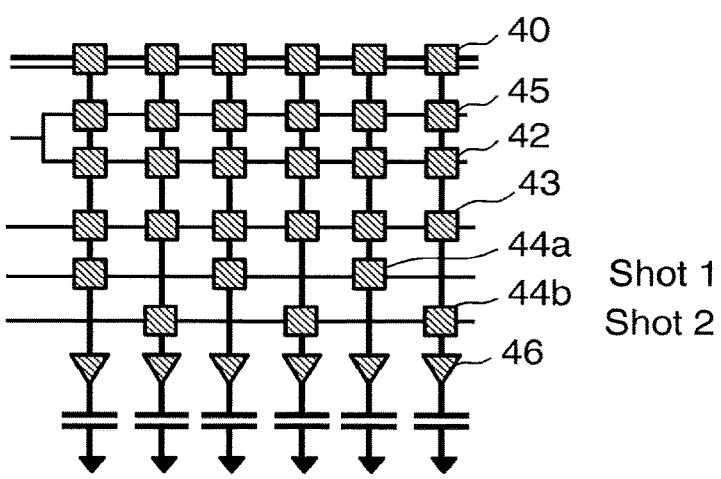

FIGS. 15A and 15B are conceptual diagrams showing another example of the internal configuration of the individual blanking control circuit according to the first embodiment. The example described above, as shown in FIG. 15A, explains the case where grouping is performed by the register 43, but it is not limited thereto. As shown in FIG. 15B, it is also preferable to group the counter circuits 44, and to output in order shot signals, such as a shot 1 and a shot 2, individually to the counter circuit 44 in a corresponding group.

As described above, according to the first embodiment, it is possible to reduce the total beam current amount without increasing the data transmission amount. Therefore, it is possible to inhibit the Coulomb effect while inhibiting throughput degradation of multi-beam writing. Accordingly, a so-called blur and/or positional deviation of a multi-beam image due to the Coulomb effect can be avoided or reduced.

Second Embodiment

As described above, in the first embodiment, the counter circuit is mounted in the blanking aperture array mechanism, and the irradiation time of an individual beam is controlled by the counter circuit in the individual blanking mechanism 47, but it is not limited thereto. According to the second embodiment, the case of controlling the irradiation time of an individual beam by using a common blanking mechanism will be described.

Figure 16:
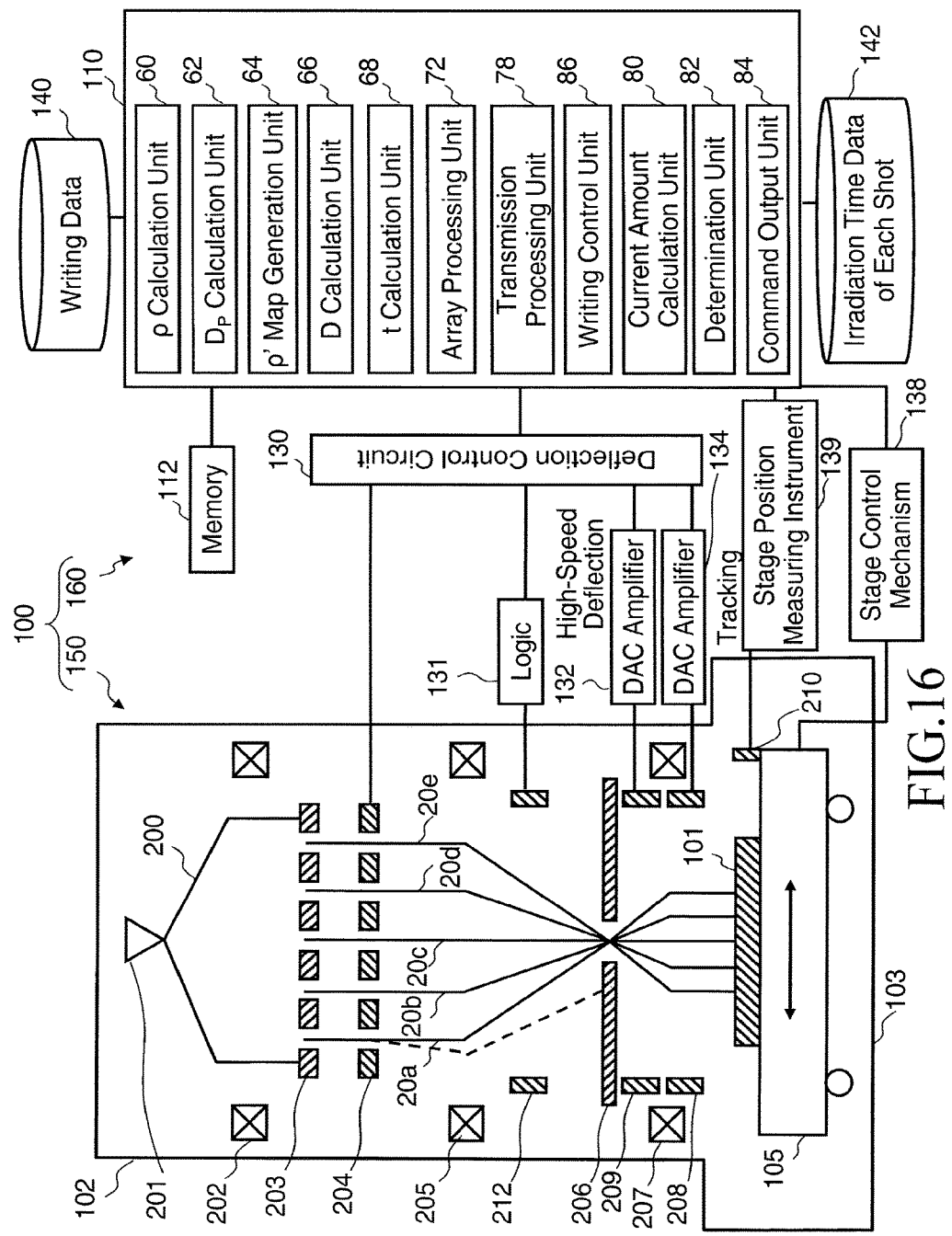
FIG. 16 is a conceptual diagram showing a configuration of a writing apparatus according to a second embodiment.

FIG. 16 is a conceptual diagram showing a configuration of a writing apparatus according to the second embodiment. FIG. 16 is the same as FIG. 1 except that a deflector 212 which can deflect the whole multi-beams 20 is arranged in the electron optical column 102, and the control system circuit 160 further includes a logic circuit 131, which is additionally connected to the deflection control circuit 130 through a bus (not shown). The logic circuit 131 is connected to the deflector 212.

Figure 17:
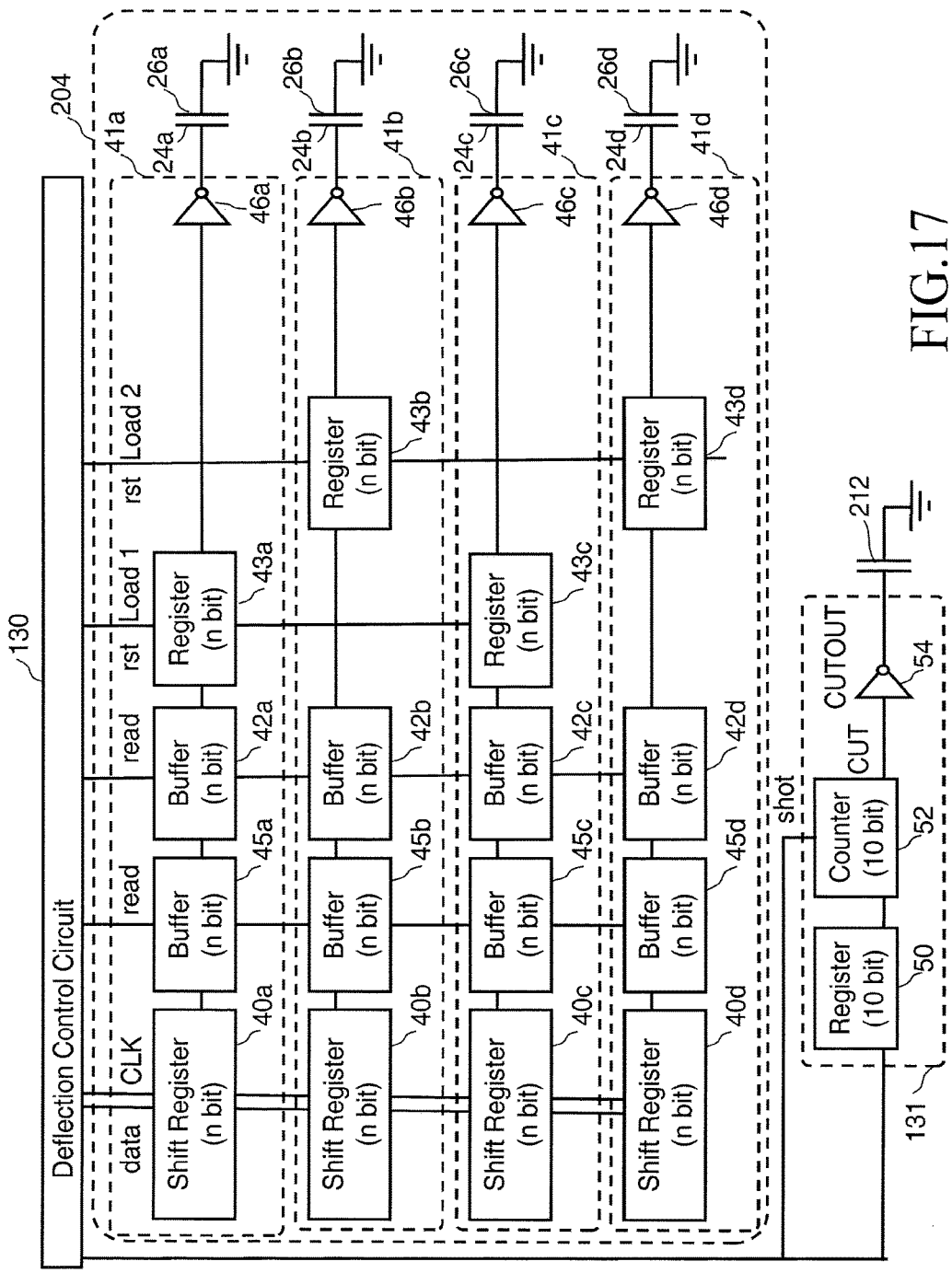
FIG. 17 is a conceptual diagram showing the internal configuration of an individual blanking control circuit and a common blanking control circuit according to the second embodiment.

FIG. 17 is a conceptual diagram showing the internal configuration of an individual blanking control circuit and a common blanking control circuit according to the second embodiment. As shown in FIG. 17, in each control circuit 41 for individual blanking control arranged in the blanking aperture array mechanism 204 inside the body of the writing apparatus 100, there are arranged the shift register 40, the buffer register 45, the buffer register 42, the register 43, and the amplifier 46. Although individual blanking control for each beam is performed by a several bit (e.g., 10-bit) control signal in the first embodiment, it is controlled by a 1 to 3 bit (e.g., 1-bit) control signal in the second embodiment. That is, a 1-bit control signal is input/output to/from the shift register 40, the buffer register 45, the buffer register 42, and the register 43. Since the amount of information of the control signal is small, the arrangement area of the control circuit 41 can be made small. In other words, even when the control circuit 41 is arranged in the blanking aperture array mechanism 204 whose arrangement space is small, more beams can be arranged at a smaller beam pitch. This increases the amount of current passing through the blanking aperture array mechanism 204, and therefore, improves the writing throughput.

Moreover, in the logic circuit 131 for common blanking, there are arranged a register 50, a counter 52, and a common amplifier 54. These do not simultaneously perform several different controls, and therefore, it is sufficient to use one circuit to perform ON/OFF control. Accordingly, even when arranging a circuit for a high speed response, no problem occurs with respect to restriction on the arrangement space and the current to be used in the circuit. Therefore, the common amplifier 54 operates at very high speed compared to the amplifier 46 realizable on the blanking aperture array mechanism 204. The amplifier 54 is controlled by a 10-bit control signal, for example. That is, for example, a 10-bit control signal is input/output to/from the register 50 and the counter 52.

According to the second embodiment, blanking control of each beam is performed by using both the beam ON/OFF control by each logic circuit 41 for individual blanking control described above and the beam ON/OFF control by the logic circuit 131 for common blanking control that collectively performs blanking control of the entire multi beams.

Figure 18:
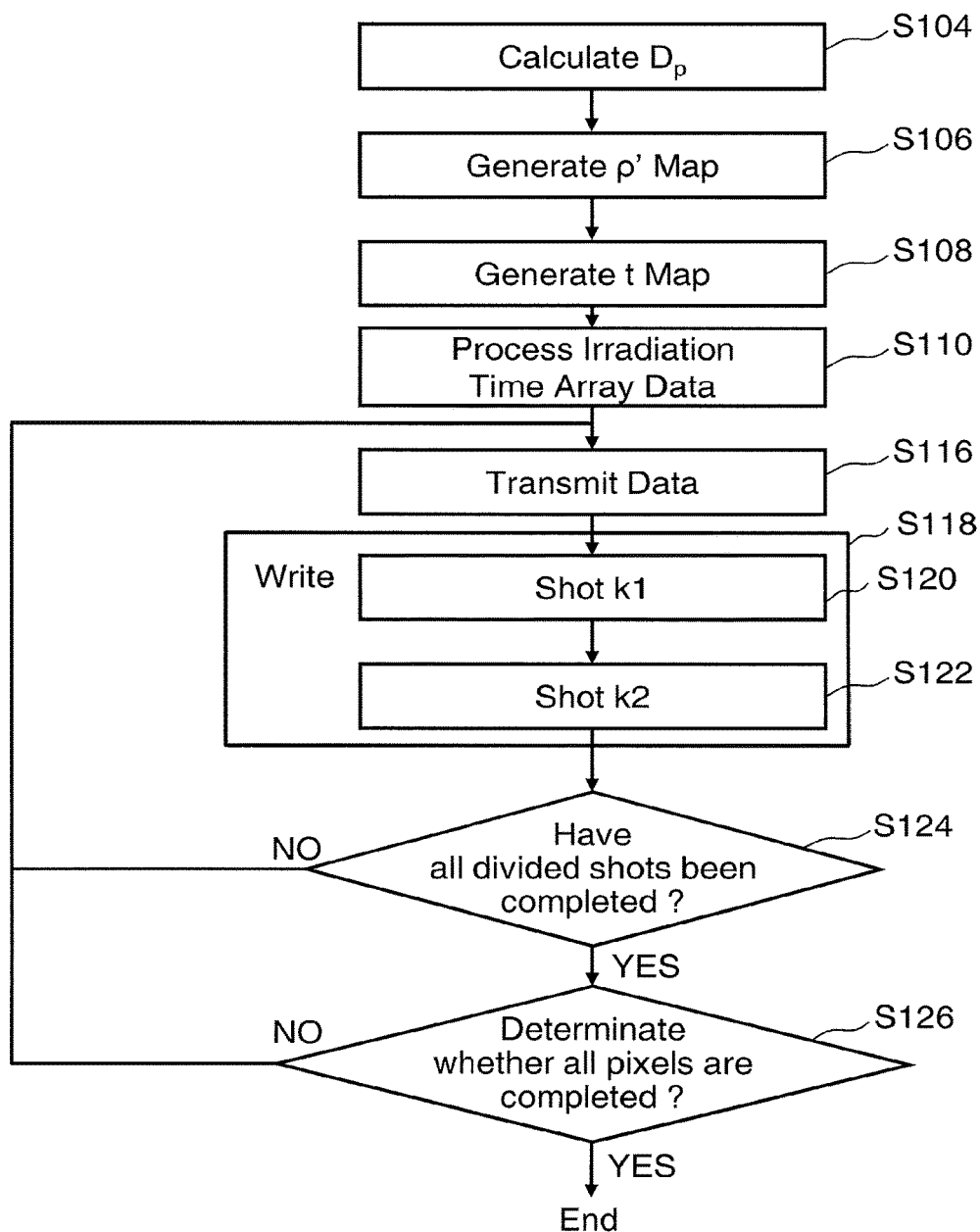
FIG. 18 is a flowchart showing main steps of a writing method according to the second embodiment.

FIG. 18 is a flowchart showing main steps of a writing method according to the second embodiment. The writing method according to the second embodiment shown in FIG. 18 is the same as that of FIG. 9 except that an irradiation time array data processing step (S110) is added between the irradiation time t map generation step (S108) and the data transmission step (S116), and that a determination step (S124) is added between the writing step (S118) and the determination step (S126). The contents of the present embodiment are the same as those of the first embodiment except what is specifically described below.

The steps from the proximity effect correction radiation coefficient Dp calculation step (S104) to the irradiation time t map generation step (S108) are the same as those of the first embodiment.

In the irradiation time array data processing step (S110), the array processing unit 72 processes an irradiation time indicated by irradiation time data of each pixel 36 into a plurality of divided shots. Specifically, it is processed as described below.

FIG. 19 shows an example of digit numbers of a plurality of divided shots and their corresponding irradiation time according to the second embodiment. In the second embodiment, one time shot of a maximum irradiation time Ttr is divided into divided shots performed n times, which continuously irradiate the same position and each of which has a different irradiation time. First, a gray-scale value Ntr is defined by dividing the maximum irradiation time Ttr by a quantization unit A (gray-scale value resolution). For example, when n=10, it is divided into divided shots performed 10 times. When defining the gray-scale value Ntr by an n binary digits, the quantization unit A should be set in advance such that the gray-scale value Ntr is 1023 (Ntr=1023). By this, the maximum irradiation time Ttr is 1023Δ (Ttr=1023Δ). As shown in FIG. 19, each of the n divided shots has one of the irradiation time of $2^{k'}\Delta$ where the digit number k' is one of 0 to 9 (k'=0 to 9). In other words, it has the irradiation time of one of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), and Δ(=$2^0$Δ). That is, one shot of multi-beams is divided into a divided shot having the irradiation time tk' of 512Δ, a divided shot having the irradiation time tk' of 256Δ, a divided shot having the irradiation time tk' of 128Δ, a divided shot having the irradiation time tk' of 64Δ, a divided shot having the irradiation time tk' of 32Δ, a divided shot having the irradiation time tk' of 16Δ, a divided shot having the irradiation time tk' of 8Δ, a divided shot having the irradiation time tk' of 4Δ, a divided shot having the irradiation time tk' of 2Δ, and a divided shot having the irradiation time tk' of Δ.

Therefore, an arbitrary irradiation time t (=NΔ) for irradiating each pixel 36 can be defined by at least one combination of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), Δ(=$2^0$Δ), and zero (0). example, when there is a shot whose gray-scale value N is N=50, since 50=$2^5+2^4+2^1$, it means a combination of a divided shot having the irradiation time of $2^5$Δ, a divided shot having the irradiation time of $2^4$Δ, and a divided shot having the irradiation time of $2^1$Δ. When converting the gray-scale value N of an arbitrary irradiation time t for irradiating each pixel 36 into a binary number, it is preferable to define to use a value of a possible larger number of digits.

The array processing unit 72 first calculates gray-scale value N data being integers by dividing the irradiation time t acquired for each pixel 36 by a quantization unit Δ (gray scale value resolution). The gray-scale value N data is defined by a gray scale value from 0 to 1023, for example. The quantization unit Δ can be variously set, and, for example, it can be defined by 1 ns (nanosecond), etc. It is preferable that a value of 1 to 10 ns, for example, is used as the quantization unit Δ. Here, as described above, the quantization unit Δ is set such that the gray-scale value Ntr of the maximum irradiation time Ttr per shot is 1023. However, it is not limited thereto. What is necessary is to set the quantization unit Δ such that the gray-scale value Ntr of the maximum irradiation time Ttr is 1023 or less.

The array processing unit 72 determines, for each pixel 36, whether to make each divided shot of a plurality of divided shots beam ON or beam OFF so that the total irradiation time of divided shots to be beam ON may be a combination equivalent to a calculated beam irradiation time. The irradiation time t acquired for each pixel 36 is defined by the following equation (1) using an integer $w_{k'}$, indicating either value 0 or 1, and an irradiation time $t_{k'}$, of the k'-th digit divided shot in n divided shots. The divided shot whose integer $w_{k'}$ is 1 is determined to be ON, and the divided shot whose integer $w_{k'}$ is 0 (zero) is determined to be OFF.

$$t = \sum_{k'=0}^{n-1} w_{k'} t_{k'} \quad (1)$$

For example, when N=700, it becomes w9=1, w8=0, w7=1, w6=0, w5=1, w432 1, w3=1, w2=1, w1=0, and w0=0. Therefore, it can be determined that the divided shot of t9 is ON, the divided shot of t8 is OFF, the divided shot of t7 is ON, the divided shot of t6 is OFF, the divided shot of t5 is ON, the divided shot of t4 is ON, the divided shot of t3 is ON, the divided shot of t2 is ON, the divided shot of t1 is OFF, and the divided shot of t0 is OFF.

Next, the array processing unit 72 generates irradiation time array data of a divided shot for dividing one time shot into divided shots performed a plurality of times which continuously irradiate the same position and each of which has a different irradiation time. The array processing unit 72 generates, for each pixel 36, irradiation time array data of a divided shot to be applied to the pixel concerned. For example, when N=50, 50=$2^5+2^4+2^1$. Therefore, it becomes "0000110010". For example, when N=500, it becomes "0111110100". When N=700, it becomes "1010111100". For example, when N=1023, it becomes "1111111111".

The array processing unit 72 processes irradiation time array data in order of beam shot. As explained with reference to FIG. 8, the pixel 36 adjacent in the direction of stage movement is not necessarily shot subsequently. Therefore, here, the array processing unit 72 processes the order such that irradiation time array data of each pixel 36 is arranged in order of pixel 36 to be shot by the multi-beams 20 sequentially in accordance with the writing sequence. Also, with respect to each divided shot in each shot, the array processing unit 72 processes the order such that the ON/OFF control signals are arranged in order of the shift registers 40 connected in series. The processed ON/OFF control signal is stored in the storage device 142.

In the data transmission step (S116), for each divide shot, the transmission processing unit 78 transmits, in a batch, the ON/OFF control signals each for the shot concerned to the deflection control circuit 130. For each divided shot, the deflection control circuit 130 transmits, in a batch, the ON/OFF control signals each for each beam of the multi-beams 20 to the blanking aperture array mechanism 204 (blanking apparatus). Specifically, for each divided shot, the deflection control circuit 130 transmits, in a batch, the ON/OFF control signals to the control circuits 41 each for each beam in the blanking aperture array mechanism 204.

In the writing step (S118), the writing mechanism 150 irradiates the writing substrate 101 with the multi-beams 20 in accordance with the ON/OFF control signals each for each beam transmitted in a batch, while shifting the irradiation timing for each group obtained by grouping the multi-beams 20 into a plurality of groups by a plurality of individual blanking mechanisms 47 mounted in the blanking aperture array mechanism 204. Specifically, it operates as follows:

According to the second embodiment, individual blanking control for each beam is performed by an n-bit (e.g., 1-bit) control signal. Here, for example, with respect to the multi-beams 20 composed of p×q beams in an array (matrix), the shift registers 40 in the control circuits 41 for p beams in the same row are connected in series. The example of FIG. 17 shows the case, as in FIG. 10, where the shift registers 40a, 40b, 40c, and 40d of the control circuits 41 for four beams in the same row are connected in series. Then, the multi-beams 20 of p×q beams are grouped into a plurality of groups. For example, they are alternately grouped into two groups according to the column. As described above, for example, beams in odd number columns in each row are in group 1, and beams in even number columns in each row are in group 2. The registers 43 (storage devices) in the same group are connected with each other. In the example of FIG. 17, with respect to control circuits 41a to 41d for four beams corresponding to the rows of the shift registers 40 connected in series, the registers 43a and 43c are connected as being in the same group, and the registers 43b and 43d are connected as being in the same group. It is preferable to perform grouping such that adjacent beams belong to different groups. Then, according to the second embodiment, a plurality of registers 43 (storage devices) arranged inside the substrate 31 output ON/OFF control signals stored in the registers 43 concerned to the corresponding amplifiers 46 (switching circuits), while shifting the timing for each group. Hereinafter, it will be described specifically.

Figure 20:
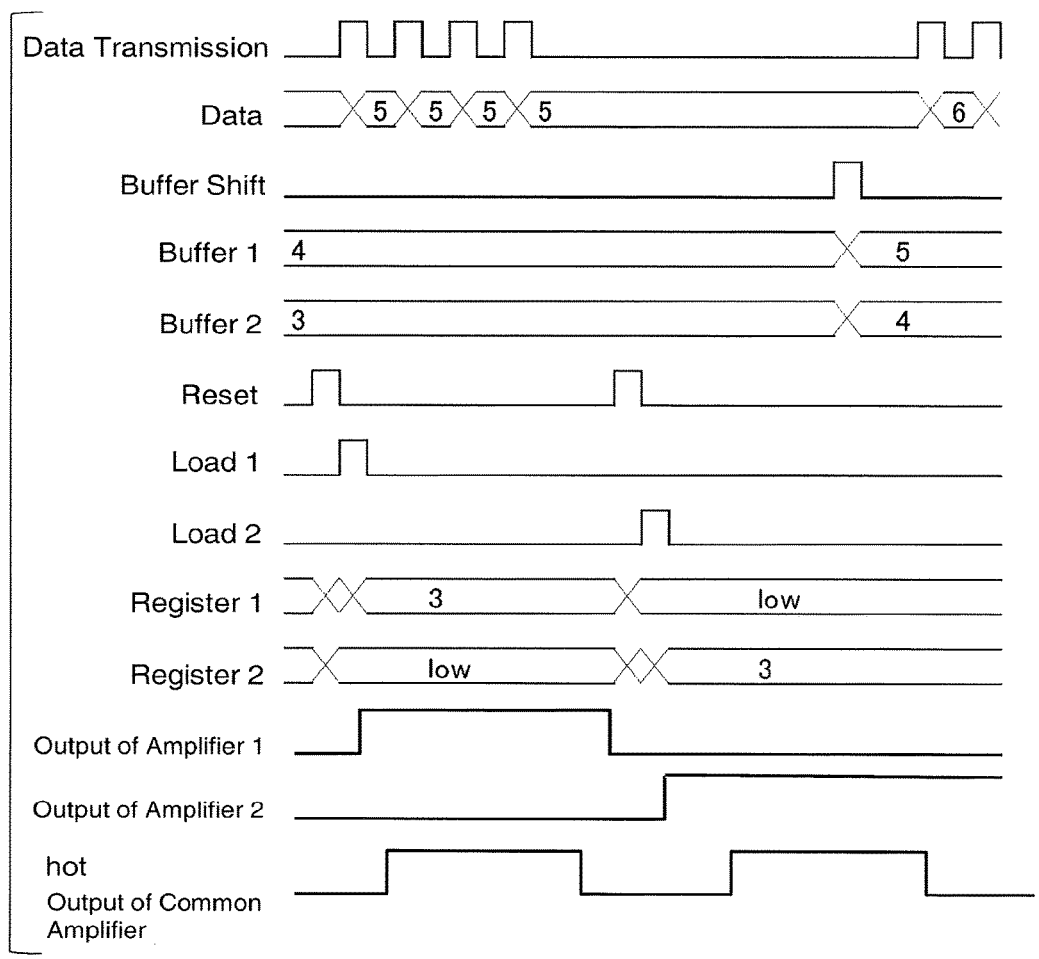
FIG. 20 shows transmission processing of the ON/OFF control signal for multi-beams and an operation in the control circuit according to the second embodiment.

FIG. 20 shows transmission processing of the ON/OFF control signal for multi-beams and an operation in the control circuit according to the second embodiment. As described above, according to the second embodiment, there are serially connected the shift registers 40a, 40b, 40c, 40d, and so on for p beams in the same row in the multi-beams 20 composed of p×q beams. Therefore, in one shot of the multi-beams, there are n-bit ON/OFF control signals grouped for each row of the multi-beams, where the number of the grouped ON/OFF control signals is the number of columns of the multi-beams. Such data group is transmitted in a batch to the blanking aperture array mechanism 204 from the deflection control circuit 130, for each divided shot of the multi-beams. For example, the data groups are parallelly transmitted in a batch. As shown in FIG. 20, when the ON/OFF control signals for the (k+2)th divided shot are transmitted in a batch, for example, the ON/OFF control signal of each beam is stored in the corresponding shift register 40 by clock signals performed p times, for example. The example of FIG. 20 shows the case where the ON/OFF control signals of the fifth divided shot (k'=fifth digit divided shot) are transmitted in a batch. In the case of FIG. 20, the ON/OFF control signals of four beams are stored in the corresponding shift registers 40a, 40b, 40c, and 40d by clock signals performed four times.

The ON/OFF control signals for the (k+1)th divided shot have been stored in a buffer register 45a (buffer 1) for each beam at the time when the ON/OFF control signals of the (k+2)th divided shot are being transmitted in a batch. Moreover, at the same period, the ON/OFF control signals for the k-th divided shot have been stored in a buffer register 42a (buffer 2) for each beam. In the case of FIG. 11, the ON/OFF control signals for the last (previous, most recent) divided shot, that is the fourth divided shot (k'=sixth digit divided shot), haven been stored in the buffer register 45a (buffer 1) for each beam at the time when the ON/OFF control signals for the fifth divided shot (k'=fifth digit divided shot) are being transmitted in a batch. The ON/OFF control signals for the last-but-one divided shot, that is the third divided shot (k'=seventh digit divided shot), have been stored in the buffer register 42a (buffer 2) for each beam.

While the ON/OFF control signals for the (k+2)th divided shot are being transmitted in a batch, a reset signal is output to each register 43 and register 50 from the deflection control circuit 130. Thereby, the ON/OFF control signals stored in the registers 43 for all the beams are eliminated. Similarly, the ON/OFF control signals stored in the registers 50 for common blanking are eliminated.

Next, in the shot k1 step (S120), first, the deflection control circuit 130 outputs a read 1 signal (load 1) of the group 1 to the register 43 of the group 1. Accordingly, the ON/OFF control signal for the k-th divided shot stored in the buffer register 42a (buffer 2) is read into the register 43 (register 1) of the group 1. On the other hand, since the registers 43 (register 2) of the group 2 have been in a reset state, the ON/OFF control signal for the divided shot is not read. Therefore, in such a state, the ON/OFF control signals for the k-th divided shot (third divided shot in the example of FIG. 20) have been stored only in the registers 43 (register 1) of the group 1. Thereby, the amplifier 46 for each beam switches the electric potential to be applied to the control electrode 24 in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON state. For example, if the ON/OFF control signal is "0", an L electric potential is input to the CMOS inverter circuit. By this, the output of the CMOS inverter circuit becomes a positive potential, thereby becoming a beam OFF state.

Moreover, at the same moment, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a first shot signal (for group 1) to the counter circuit 52 of the logic circuit 131 in the common blanking mechanism. Accordingly, the counter circuit 44 for common blanking outputs a beam ON signal to the common amplifier 54 only during the time indicated by the common ON/OFF control signal stored in the register 50 for common blanking. Specifically, the number of counts equivalent to the irradiation time of the current divided shot is counted by the clock cycle. Then, only during the counting, the input of the CMOS inverter circuit (not shown) is made to be H (active). After the time indicated by the common ON/OFF control signal has passed, a beam OFF signal is output to the common amplifier 54. Specifically, after completing the counting, the input of the CMOS inverter circuit is made to be L.

Here, for the k-th divided shot, a deflection electric potential for beam ON or beam OFF has already been applied to the control electrode 24 from the amplifier 46 for the beam of the group 1 in accordance with the ON/OFF control signal. On the other hand, a deflection electric potential (positive potential) for beam OFF has already been applied to the control electrode 24 from the amplifier 46 for the beam of the group 2. In such a state, the irradiation time of the current divided shot is controlled by the deflector 212 for common blanking. That is, only while the counter circuit 44 is outputting a beam ON signal, the entire multi-beams 20 can pass through the limiting aperture 206 without being blanking-deflected. By contrast, during the other time, the entire multi-beams 20 is blanking-deflected and blocked by the limiting aperture 206. Thereby, the k-th divided shot (shot k1) of the group 1 is executed.

When the divided shot (shot 1) of the group is finished, the deflection control circuit 130 outputs a reset signal to each register 43. By this, the ON/OFF control signals stored in the registers 43 for all the beams are eliminated.

Next, in the shot k2 step (S122), first, the deflection control circuit 130 outputs a read 2 signal (load 2) of the group 2 to the register 43 of the group 2. Accordingly, the ON/OFF control signal for the k-th divided shot stored in the buffer register 42a (buffer 2) is read into the register 43 (register 2) of the group 2. On the other hand, since the registers 43 (register 1) of the group 1 have been in a reset state, the ON/OFF control signal for the divided shot is not read. Therefore, in such a state, the ON/OFF control signals for the k-th divided shot (third divided shot in the example of FIG. 20) have been stored only in the registers 43 (register 2) of the group 2. Thereby, the amplifier 46 for each beam switches the electric potential to be applied to the control electrode 24 in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON state. For example, if the ON/OFF control signal is "0", an L electric potential is input to the CMOS inverter circuit. By this, the output of the CMOS inverter circuit becomes a positive potential, thereby becoming a beam OFF state.

Moreover, at the same moment, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a second shot signal (for group 2) to the counter circuit 52 of the logic circuit 131 in the common blanking mechanism. Accordingly, the counter circuit 44 for common blanking outputs a beam ON signal to the common amplifier 54 only during the time indicated by the common ON/OFF control signal stored in the register 50 for common blanking. After the time indicated by the common ON/OFF control signal has passed, a beam OFF signal is output to the common amplifier 54.

Here, for the k-th divided shot, a deflection electric potential for beam ON or beam OFF has already been applied to the control electrode 24 from the amplifier 46 for the beam of the group 2 in accordance with the ON/OFF control signal. On the other hand, a deflection electric potential (positive potential) for beam OFF has already been applied to the control electrode 24 from the amplifier 46 for the beam of the group 1. In such a state, the irradiation time of the current divided shot is controlled by the deflector 212 for common blanking. That is, only while the counter circuit 44 is outputting a beam ON signal, the entire multi-beams 20 can pass through the limiting aperture 206 without being blanking-deflected. By contrast, during the other time, the entire multi-beams 20 is blanking-deflected and blocked by the limiting aperture 206. Thereby, the k-th divided shot (shot k2) of the group 2 is executed.

As described above, in the second embodiment, as in the first embodiment, a plurality of CMOS inverter circuits (amplifiers 46) (an example of a switching circuit) for the multi-beams 20 are arranged inside the substrate 31, individually connected to a plurality of registers 43, and each switches the electric potential of binary values in accordance with the ON/OFF control signal stored in the corresponding register 43. Then, during the ON/OFF control signal being transmitted, the CMOS inverter circuit continuously performs shots k1 and k2 of each group while shifting the irradiation timing.

After the load 2 signal has been output and the ON/OFF control signals for the (k+2)th divided shot have been transmitted in a batch, the deflection control circuit 130 outputs buffer shift signals to the buffer registers 45 and 42. By this, the ON/OFF control signals for the (k+2)th divided shot stored in the shift registers 40 are shifted to the buffer registers 45 (buffer 1) for respective beams. Simultaneously, the ON/OFF control signals for the (k+1)th divided shot stored in the buffer registers 45 are shifted to the buffer registers 42 (buffer 2) for respective beams.

After the buffer shift signal has been output, ON/OFF control signals for the next (k+3)th divided shot are begun to be transmitted in a batch. Hereinafter, it is repeated similarly. Thus, storage devices, such as the shift registers 40, the buffer registers 45, the buffer registers 42, and the registers 43 are arranged inside the substrate 31, and temporarily store the respective ON/OFF control signals for the multi-beams 20 transmitted in a batch. Specifically, a plurality of registers 43 (storage device) for the multi-beams 20 perform grouping of the multi-beams 20, and temporarily store the respective ON/OFF control signals for the multi-beams 20 transmitted in a batch.

FIG. 20 illustrates the case where the current divided shot is performed while a data transmission for the divided shot after the next one is being performed using the two buffer registers 45 and 42. However, it is not limited thereto. It is also acceptable that the current divided shot is performed while a data transmission for the next divided shot is being performed using the one buffer register 42.

As described above, according to the second embodiment, it is not necessary to divide data transmission for each group. Therefore, degradation of the throughput can be inhibited. Moreover, according to the second embodiment, the ON/OFF control signal to be transmitted has no information to identify the group for which divided shot timing should be shifted. Nonetheless, as shown in FIGS. 17 and 20, by the circuit configuration in the blanking aperture array mechanism 204, beam irradiation is performed based on data having been transmitted for the same divided shot, while shifting the irradiation timing of the same divided shot for each group. Thereby, it becomes unnecessary to define special information in the ON/OFF control signal. Moreover, according to the second embodiment, it is unnecessary to perform controlling while particularly identifying beam groups by the control mechanism, such as the control computer 110 and the deflection control circuit 130.

In the determination step (S124), the writing control unit 86 determines whether all divided shots in one shot have been completed. When all the divided shots have been completed, it proceeds to the determination step (S126). When all the divided shots have not been completed yet, it returns to the data transmission step (S116), and repeats each step from the data transmission step (S116) to the determination step (S124) until all the divided shots in one shot have been completed.

In the determination step (S126), the writing control unit 86 determines whether the writing processing for all the pixels 36 has been completed. If the writing processing for all the pixels 36 has been completed, the flow is finished. If the writing processing for all the pixels 36 has not been completed yet, it returns to the data transmission step (S116), and repeats each step after the data transmission step (S116).

Figure 21:
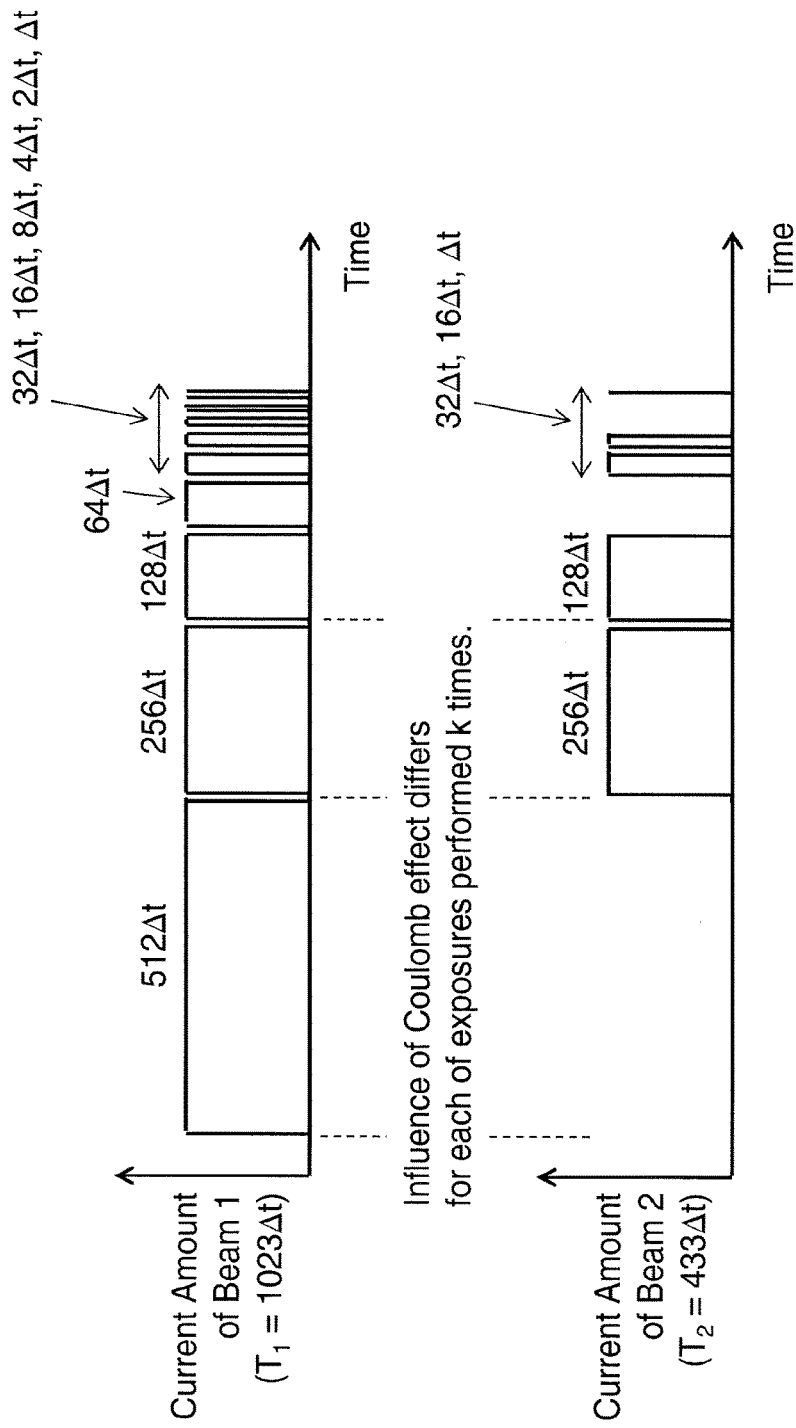
FIG. 21 illustrates a relation between a beam shot and a Coulomb effect according to a comparative example of the second embodiment.

FIG. 21 illustrates a relation between a beam shot and a Coulomb effect according to a comparative example of the second embodiment. In the comparative example of the second embodiment, since the irradiation time of each beam per shot is different from each other, divided shots to be combined are different. Therefore, in divided shots performed n times, there exist, for each divided shot, beams to be emitted for irradiation and beams not to be emitted for irradiation in the multi-beams 20. Accordingly, the influence of Coulomb effect differs for each exposure (divided shot). Thus, it is desirable to lower the total current amount of all the beams at the time of each exposure (divided shot). According to the second embodiment, since the multi-beams 20 is divided into a plurality of groups, and, at each shot time, the irradiation timing is shifted for each group, the total current amount of beams of each group at the time of exposure (divided shot) can be smaller than the total current amount of the whole of the multi-beams 20 at the time of exposure (divided shot). Therefore, the influence of Coulomb effect can be reduced. Moreover, since data transmission for each divided shot can be completed by one time transmission, degradation of the throughput due to increase of transmission time can be avoided.

Figure 22:
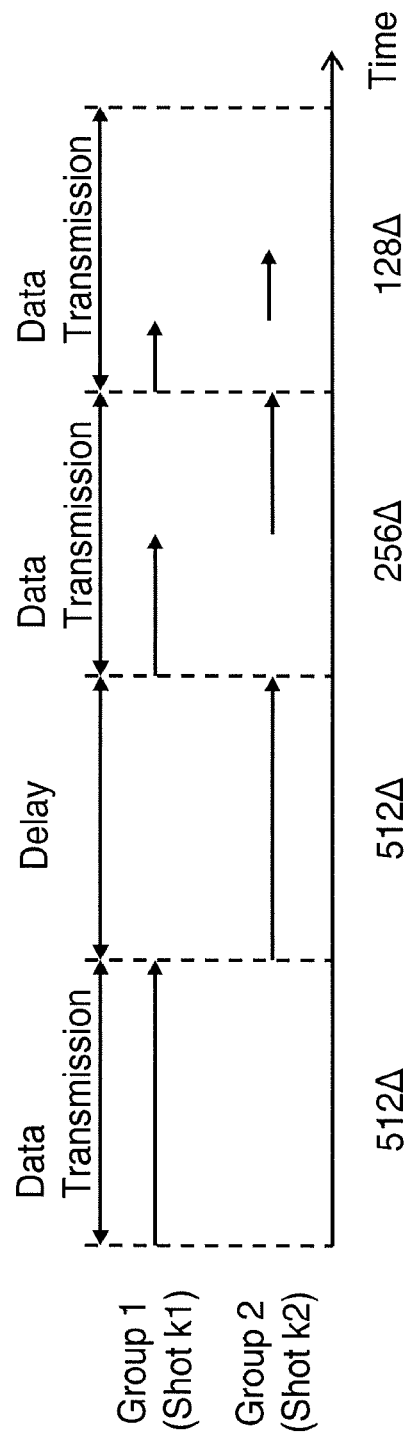
FIG. 22 shows an example of a relation between data transmission time and divided shot time according to the second embodiment.

FIG. 22 shows an example of a relation between data transmission time and divided shot time according to the second embodiment. In the second embodiment, since the control circuit 41 of the individual blanking mechanism 47 is controlled by a 1-bit to 3-bit (e.g., 1-bit) control signal, data transmission time of each divided shot can be shortened. Therefore, as shown in FIG. 22, in divided shots performed n times, with respect to divided shots whose irradiation time is longer (for example, a divided shot whose irradiation time is 512 Δ), the case occurs where divided shots of all groups cannot be completed within data transmission time. On the other hand, with respect to divided shots whose irradiation time is shorter (for example, a divided shot whose irradiation time is 128 Δ or below), divided shots of three or more groups (four or more groups in the case of FIG. 22) can be performed within data transmission time. Therefore, according to the second embodiment, writing time takes longer by one divided shot than the total time of divided shots performed n times, for example. However, since data transmission itself can be completed by one time transmission for each divided shot, it is possible to make/keep the delay time of writing time minimum.

As described above, according to the second embodiment, writing time takes longer by one divided shot than the total time of divided shots performed n times, for example. Thus, stage position control becomes complicated when performing writing while continuously moving the stage. Therefore, the second embodiment is more effective in the case of performing writing by a step-and-repeat operation than the case of writing while continuously moving the stage.

Figure 23:
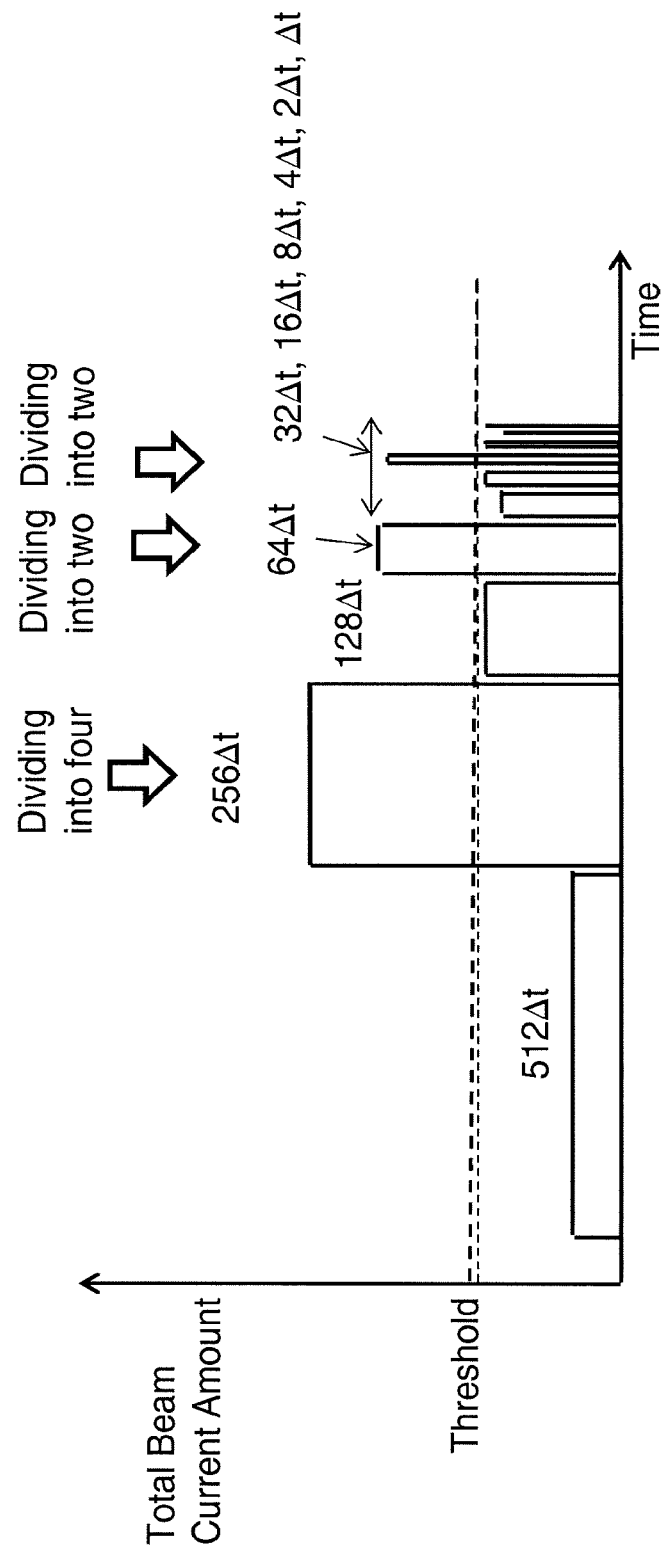
FIG. 23 shows an example of a modification of a group dividing method of multi-beams according to the second embodiment.

FIG. 23 shows an example of a modification of the group dividing method of multi-beams according to the second embodiment. In the example described above, the irradiation of the group 1 and the irradiation of the group 2 are performed irrespective of the current amount of the whole multi-beams in each divided shot. However, it is not limited thereto. As shown in FIG. 23, with respect to divided shots of the multi-beams 20, which are divided shots performed at the same time and whose total beam current amount exceeds a threshold, irradiation of the multi-beams 20 is performed in accordance with the ON/OFF control signals of respective beams transmitted in a batch, while shifting the irradiation timing for each group. On the other hand, with respect to divided shots of the multi-beams 20, which are divided shots performed at the same time and whose total beam current amount does not exceed the threshold, irradiation of the multi-beams 20 is performed in accordance with the ON/OFF control signals of respective beams transmitted in a batch, without shifting the irradiation timing for each group. Hereinafter, it will be described specifically.

In a current amount calculation step, after arranging the order of the ON/OFF control signal of each divided shot of each pixel 36 such that the ON/OFF control signals are aligned in order of the pixel 36 to be shot by the multi-beams 20 in accordance with the writing sequence, the current amount calculation unit 80 calculates, for each divided shot, the current amount of the whole multi-beams 20 of the divided shot concerned.

In a determination step, the determination unit 82 determines whether the calculated current amount of the whole multi-beams 20 of the divided shot concerned exceeds a threshold or not.

In a command output step, in the case where the calculated current amount of the whole multi-beams 20 of the divided shot concerned exceeds the threshold, the command output unit 84 outputs an identifiable signal 1 (command 1) indicating to shift the irradiation timing to the deflection control circuit 130 when transmitting the ON/OFF control signal for the divided shot concerned to the deflection control circuit 130. In the case where the calculated current amount of the whole multi-beams 20 of the shot divided concerned does not exceed the threshold, the command output unit 84 outputs an identifiable signal 2 (command 2) indicating not to shift the irradiation timing to the deflection control circuit 130 when transmitting the ON/OFF control signal for the divided shot concerned to the deflection control circuit 130.

When the command 1 is output to the deflection control circuit 130, as described above, with respect to divided shots of the multi-beams 20, which are divided shots performed at the same time and whose total beam current amount exceeds a threshold, the ON/OFF control signal stored in each register 43 is output to a corresponding CMOS inverter circuit while shifting the output timing for each group. Therefore, after the k-th divided shot (shot k1) of the group 1, the k-th divided shot (shot k2) of the group 2 is performed. On the other hand, when the command 2 is output to the deflection control circuit 130, it operates as follows:

In the shot k1 step (S120), first, the deflection control circuit 130 outputs a read 1 signal (load 1) of the group 1 to the register 43 of the group 1. At the same moment, the deflection control circuit 130 outputs a read 2 signal (load 2) of the group 2 to the register 43 of the group 2. By this, as shown in FIG. 20, the ON/OFF control signal for the k-th divided shot stored in the buffer register 42a (buffer 2) is read into the register 43 (register 1) of the group 1. Similarly, the ON/OFF control signal for the k-th divided shot stored in the buffer register 42a (buffer 2) is read into the register 43 (register 2) of the group 2. Therefore, in such a state, the ON/OFF control signals for the k-th divided shot (third divided shot in the example of FIG. 20) have been stored not only in the register 43 (register 1) of the group 1 but also in the register 43 (register 2) of the group 2. That is, in such a state, the ON/OFF control signals for the k-th divided shot (third divided shot in the example of FIG. 20) have been stored in both the register 43 (register 1) of the group 1 and the register 43 (register 2) of the group 2. Thereby, the amplifier 46 for each beam switches the electric potential to be applied to the control electrode 24 in accordance with the ON/OFF control signal stored in the register 43 for the beam concerned. For example, if the ON/OFF control signal is "1", an H electric potential (active potential) is input to the CMOS inverter circuit. By this, the output of the CMOS inverter circuit becomes a ground potential, thereby becoming a beam ON state. For example, if the ON/OFF control signal is "0", an L electric potential is input to the CMOS inverter circuit. By this, the output of the CMOS inverter circuit becomes a positive potential, thereby becoming a beam OFF state.

Moreover, at the same moment, the deflection control circuit 130 outputs a common ON/OFF control signal indicating the irradiation time of the k-th divided shot to the register 50 of the logic circuit 131 of the common blanking mechanism. Thereby, the common ON/OFF control signal for the k-th divided shot is read into the register 50 for common blanking.

Next, the deflection control circuit 130 outputs a first shot signal (for group 1) to the counter circuit 52 of the logic circuit 131 in the common blanking mechanism. Accordingly, the counter circuit 44 for common blanking outputs a beam ON signal to the common amplifier 54 only during the time indicated by the common ON/OFF control signal stored in the register 50 for common blanking. Then, after the time indicated by the common ON/OFF control signal has passed, a beam OFF signal is output to the common amplifier 54.

Then, for the k-th divided shot, a deflection electric potential for beam ON or beam OFF has already been applied to the control electrode 24 from the amplifiers 46 for beams of the groups 1 and 2 in accordance with the ON/OFF control signal. In such a state, the irradiation time of the current divided shot is controlled by the deflector 212 for common blanking. That is, only while the counter circuit 44 is outputting a beam ON signal, the entire multi-beams 20 can pass through the limiting aperture 206 without being blanking-deflected. By contrast, during the other time, the entire multi-beams 20 is blanking-deflected and blocked by the limiting aperture 206. Thereby, the k-th divided shot (shot k1) of the group 1 and the k-th divided shot (shot k2) of the group 2 are simultaneously executed.

In such a case, since it is not necessary to perform the shot k2 after the shot k1, shifting to the next (k+1)th shot can be performed. For example, with respect to divided shots having the irradiation time (e.g., 512 Δ) with which it is impossible to in order complete divided shots of a plurality of groups within data transmission time, the method described above makes it possible to complete all divided shots of a plurality of groups within the data transmission time as long as the total current amount does not exceed a threshold.

It is also preferable to make the number of groups variable for each shot (or divided shot), such as divided shots of two groups, and divided shots of four groups as shown in FIG. 23. For accomplishing this, grouping of the register 43 may be adjusted.

Further, it is more preferable, as shown in FIGS. 14A and 14B, to perform grouping not into two groups but into four groups such that adjacent beams in the row and column directions belong to different groups. Accordingly, the influence of the Coulomb effect from the adjacent beam can further be eliminated than the case of being adjacent only in the row direction or column direction.

As described above, according to the second embodiment, it is possible to reduce the total beam current amount without increasing the data transmission amount. Therefore, it is possible to inhibit the Coulomb effect while inhibiting throughput degradation of multi-beam writing. Accordingly, a so-called blur and/or positional deviation of a multi-beam image due to the Coulomb effect can be avoided or reduced.

Embodiments have been explained referring to specific examples described above. However, the present invention is not limited to these specific examples. Although the above examples describe the case where a shot or a plurality of divided shots is performed once for each pixel, it is not limited thereto. Further, it is also preferable to perform multiple writing with L passes. For example, it is preferable that a shot or a plurality of divided shots is performed for each pass of multiple writing with L passes.

Moreover, since a region irradiated by a beam remains as a resist pattern in negative resist, not only substantial patterns but also a region where no substantial pattern exists should be written. Therefore, preferably, the number of groups is set to be one for a region where no substantial pattern exists (where low dimensional accuracy is acceptable), and to be two or more for a region where a substantial pattern exists (where high dimensional accuracy is required).

Moreover, in the examples described above, although the register is used as a storage device, such as the buffer register 45, the buffer register 42, and the register 43, it is not limited thereto. A memory can be used instead of the register.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam exposure apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam exposure method comprising:
    transmitting ON/OFF control signals each being an ON/OFF control signal for a corresponding beam of multi-beams of charged particle beams in a batch to a blanking apparatus in which there is mounted a substrate where a plurality of passage holes are formed to let a corresponding beam of the multi-beams individually pass therethrough, and a plurality of individual blanking mechanisms arranged in the substrate to individually perform blanking deflection of each beam of the multi-beams; and
    irradiating a substrate to be written, with the multi-beams in accordance with the ON/OFF control signals transmitted in the batch, while shifting an irradiation timing for each group obtained by grouping the multi-beams into a plurality of groups by the plurality of individual blanking mechanisms mounted in the blanking apparatus, wherein
    irradiation of the multi-beams is performed in accordance with the ON/OFF control signals transmitted in the batch, while shifting the irradiation timing for the each group with respect to shots of the multi-beams, which are shots performed at a same time and whose total beam current amount exceeds a threshold, and
    irradiation of the multi-beams is performed in accordance with the ON/OFF control signals transmitted in the batch, without shifting the irradiation timing for the each group with respect to shots of the multi-beams, which are shots performed at the same time and whose total beam current amount does not exceed the threshold.

2. A multi charged particle beam exposure method comprising:
    transmitting ON/OFF control signals each being an ON/OFF control signal for a corresponding beam of multi-beams of charged particle beams in a batch to a blanking apparatus in which there see is mounted a substrate where a plurality of passage holes are fainted to let a corresponding beam of the multi-beams individually pass therethrough, and a plurality of individual blanking mechanisms arranged in the substrate to individually perform blanking deflection of each beam of the multi-beams;
    irradiating a substrate to be written, with the multi-beams in accordance with the ON/OFF control signals transmitted in the batch, while shifting an irradiation timing for each group obtained by grouping the multi-beams into a plurality of groups by the plurality of individual blanking mechanisms mounted in the blanking apparatus;
    temporarily individually storing each of the ON/OFF control signals transmitted in the batch, in a corresponding first storage device in a plurality of first storage devices in the blanking apparatus;
    temporarily storing ON/OFF control signals for some beams of the multi-beams, in the ON/OFF control signals for the multi-beams having been transmitted in the batch and stored in the plurality of first storage devices, in a plurality of second storage devices in the blanking apparatus, and
    temporarily storing ON/OFF control signals for other beams in the multi-beams except for the some beams, in the ON/OFF control signals for the multi-beams having been transmitted in the batch, in a plurality of third storage devices in the blanking apparatus at a time shifted from a time of the storing into the plurality of second storage devices in the blanking apparatus.

3. The method according to claim 2, wherein a state that information stored in the plurality of third storage devices has been reset is maintained during a period in which the ON/OFF control signals for the some beams of the multi-beams are stored in the plurality of second storage devices.

4. The method according to claim 3, wherein a state that information stored in the plurality of second storage devices has been reset is maintained during a period in which the ON/OFF control signals for the other beams in the multi-beams except for the some beams of the multi-beams are stored in the plurality of third storage devices.

5. The method according to claim 4, further comprising:
    reading the information stored in the plurality of second storage devices and the information stored in the plurality of third storage devices in a state where the ON/OFF control signals for the some beams of the multi-beams are stored in the plurality of second storage devices, and the information stored in the plurality of third storage devices has been reset.

6. The method according to claim 5, further comprising:
    reading the information stored in the plurality of second storage devices and the information stored in the plurality of third storage devices in a state where the ON/OFF control signals for the other beams in the multi-beams except for the some beams are stored in the plurality of third storage devices, and the information in the plurality of second storage devices has been reset.

7. A multi charged particle beam blanking apparatus comprising:
    a substrate in which a plurality of passage holes in an array are formed to let a corresponding beam of multi-beams of charged particle beams individually pass therethrough;
    a plurality of storage devices, arranged inside the substrate, configured to temporarily store ON/OFF control signals each being an ON/OFF control signal for a corresponding beam of the multi-beams transmitted in a batch and to group the multi-beams into a plurality of groups;
    a plurality of switching circuits, arranged inside the substrate and each individually connected to a corresponding storage device of the plurality of storage devices, each configured to switch a first electric potential and a second electric potential each other in accordance with the ON/OFF control signal stored in the corresponding storage device of the plurality of storage devices; and
    a plurality of electrode pairs each composed of two electrodes, arranged at the substrate such that the two electrodes are opposite each other with respect to a corresponding one of the plurality of passage holes, configured to individually perform blanking deflection of a corresponding beam of the multi-beams by one of the first and second electric potentials switched by a corresponding switching circuit in the plurality of switching circuits, wherein the plurality of storage devices output the ON/OFF control signal stored to a corresponding switching circuit while shifting an output timing for each group of the plurality of groups.

8. The apparatus according to claim 7, wherein, with respect to shots of the multi-beams, which are shots performed at a same time and whose total beam current amount exceeds a threshold, the ON/OFF control signal stored in each storage device is output to a corresponding switching circuit while shifting an output timing for the each group, and with respect to shots of the multi-beams, which are shots performed at a same time and whose total beam current amount does not exceed the threshold, the ON/OFF control signal stored in the each storage device is output to a corresponding switching circuit without shifting the output timing for the each group.

9. The apparatus according to claim 7, wherein the plurality of storage devices are grouped such that adjacent beams belong to different groups.

* * * * *